(12) United States Patent
Kim et al.

(10) Patent No.: US 10,129,989 B2
(45) Date of Patent: Nov. 13, 2018

(54) ELECTRONIC DEVICE INCLUDING GLASS HOUSING

(71) Applicant: SAMSUNG ELECTRONICS CO., LTD., Suwon-si, Gyeonggi-do (KR)

(72) Inventors: Jung-Hyun Kim, Suwon-si (KR); Tae-Kon Kim, Yongin-si (KR); Seung-Taek Oh, Seoul (KR); Jong-Chul Choi, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/834,481

(22) Filed: Dec. 7, 2017

(65) Prior Publication Data

US 2018/0184532 A1   Jun. 28, 2018

(30) Foreign Application Priority Data

Dec. 23, 2016 (KR) .................. 10-2016-0177648

(51) Int. Cl.
| | |
|---|---|
| *H05K 5/00* | (2006.01) |
| *H05K 5/02* | (2006.01) |
| *H05K 5/03* | (2006.01) |
| *C03C 19/00* | (2006.01) |
| *C03C 17/22* | (2006.01) |

(52) U.S. Cl.
CPC ......... *H05K 5/0017* (2013.01); *H05K 5/0004* (2013.01); *H05K 5/0226* (2013.01); *H05K 5/0286* (2013.01); *H05K 5/03* (2013.01); *C03C 17/22* (2013.01); *C03C 19/00* (2013.01); *C03C 2217/78* (2013.01); *C03C 2218/112* (2013.01); *H05K 5/0086* (2013.01)

(58) Field of Classification Search
None
See application file for complete search history.

(56) References Cited

U.S. PATENT DOCUMENTS

| 5,242,517 A | 9/1993 | Endoh |
| 6,178,094 B1 * | 1/2001 | Hakozaki ............. H05K 7/1418 |
| | | 16/95 R |

(Continued)

OTHER PUBLICATIONS

Extended Search Report dated Feb. 28, 2018 in counterpart European Patent Application No. 17209381.7.

*Primary Examiner* — Xanthia C Cunningham
(74) *Attorney, Agent, or Firm* — Nixon & Vanderhye, P.C.

(57) ABSTRACT

An electronic device may comprise a housing including two opposite open ends and at least a portion comprising a light-transmitting material, a bracket disposed inside the housing and having a shape corresponding to the housing, a flexible display device disposed between the housing and the bracket and configured to display information to an outside through the light-transmitting portion of the housing, and a plurality of covers closing the open ends of the housing and supporting two opposite ends of the bracket, wherein the bracket may include an inner space for mounting electronic parts, and the bracket is length-adjustable in at least one direction. The housing may be formed of a glass tube. Thus, the housing may be formed into a desired shape by processing the glass tube. A stretchable bracket structure may be implemented inside the housing to come in tight contact with the housing.

20 Claims, 21 Drawing Sheets

(56) References Cited

U.S. PATENT DOCUMENTS

| | | | |
|---|---|---|---|
| 8,532,480 B2* | 9/2013 | Hietala | B29C 45/4421 396/535 |
| 8,564,961 B2* | 10/2013 | Weber | H05K 5/0243 307/125 |
| 8,665,236 B2 | 3/2014 | Myers | |
| 8,749,987 B2* | 6/2014 | Weber | H01R 13/6315 361/679.02 |
| 9,189,016 B2* | 11/2015 | Jang | G06F 1/1652 |
| 9,781,846 B2* | 10/2017 | Sanford | H05K 5/0013 |
| 9,823,708 B2* | 11/2017 | Zadesky | G06F 1/1684 |
| 9,838,518 B2* | 12/2017 | Lei | G06F 1/1652 |
| 9,939,844 B2* | 4/2018 | Choi | G06F 1/1643 |
| 2006/0268528 A1* | 11/2006 | Zadesky | H04M 1/0202 361/728 |
| 2009/0270142 A1* | 10/2009 | Liang | G06F 1/1626 455/575.1 |
| 2010/0117975 A1* | 5/2010 | Cho | G06F 1/1626 345/173 |
| 2010/0216514 A1* | 8/2010 | Smoyer | G06F 1/1647 455/566 |
| 2012/0243151 A1* | 9/2012 | Lynch | H04M 1/0202 361/679.01 |
| 2013/0033434 A1* | 2/2013 | Richardson | G06F 3/0488 345/173 |
| 2013/0076612 A1 | 3/2013 | Myers | |
| 2013/0328792 A1 | 12/2013 | Myers | |
| 2015/0160699 A1* | 6/2015 | Choi | G06F 1/1643 345/173 |
| 2016/0170100 A1* | 6/2016 | Wang | G02B 5/04 600/301 |
| 2017/0094772 A1* | 3/2017 | Gwin | H05K 1/0204 |
| 2017/0251564 A1* | 8/2017 | Jun | H05K 5/069 |
| 2018/0084092 A1* | 3/2018 | Cho | H04M 1/0262 |
| 2018/0088398 A1* | 3/2018 | Lee | G02F 1/133385 |

* cited by examiner

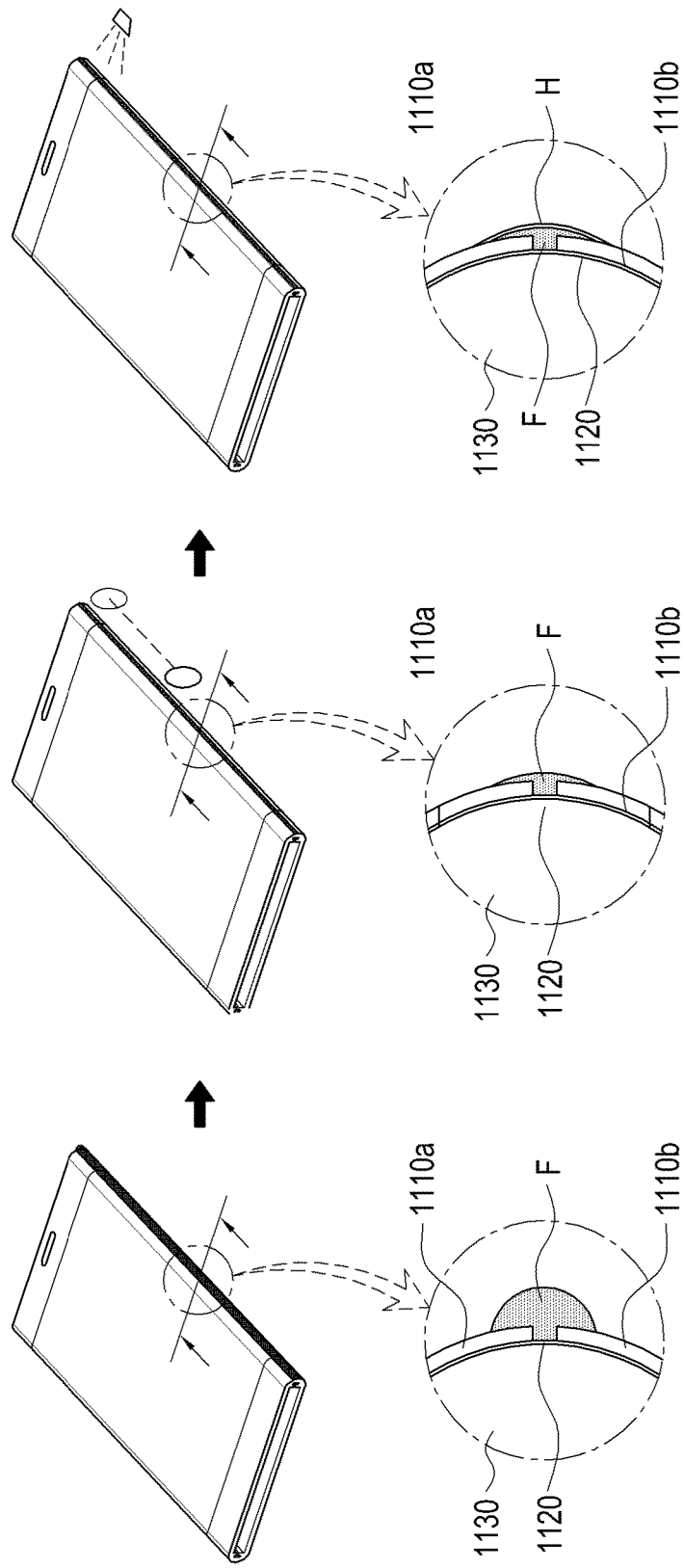

US 10,129,989 B2

ELECTRONIC DEVICE INCLUDING GLASS HOUSING

CROSS-REFERENCE TO RELATED APPLICATION

This application is based on and claims priority under 35 U.S.C. § 119 to a Korean patent application filed in the Korean Intellectual Property Office on Dec. 23, 2016 and assigned Serial No. 10-2016-0177648, the disclosure of which is incorporated by reference herein in its entirety.

TECHNICAL FIELD

The present disclosure relates generally to electronic devices including glass housings.

DISCUSSION OF RELATED ART

Flat (or 2D & 2.5D) or curved (or 3D) displays are typically adopted for mobile devices.

In designing a three-dimensional (3D) housing for mobile devices, e.g., a housing bent at 90 degrees or more, the housing should remain in the same thickness, rendering it difficult to implement various shapes.

Adopting a glass tube as a housing for mobile devices requires a new approach for mounting a display inside the housing.

The above information is presented as background information only to assist with an understanding of the present disclosure.

SUMMARY

According to an example embodiment of the present disclosure, a housing may comprise a glass tube. Thus, the housing may be formed into a desired shape by processing the glass tube.

According to an example embodiment of the present disclosure, a stretchable bracket structure may be implemented inside the housing and be configured to come in tight contact with the housing.

According to an example embodiment of the present disclosure, covers are fit into the two open ends of the tubular glass housing, preventing and/or reducing the housing from external impacts while allowing a better look in light of design.

According to an example embodiment of the present disclosure, an electronic device may comprise a housing including two opposite open ends and at least a portion comprising a light-transmitting material, a bracket disposed inside the housing and having a shape corresponding to the housing, a flexible display device disposed between the housing and the bracket and configured to display information to an outside through the light-transmitting portion of the housing, and a plurality of covers disposed to close the open ends of the housing and configured to support two opposite ends of the bracket, wherein the bracket may include an inner space for mounting electronic parts, wherein the bracket is length-adjustable in at least one direction.

According to an example embodiment of the present disclosure, a method for manufacturing an electronic device may comprise preparing a housing including two opposite open ends and at least a portion comprising a light-transmitting material, preparing a bracket having a shape corresponding to the housing and being length-adjustable in a plurality of directions, placing a flexible display device to surround at least a portion of the bracket, attaching the housing with the bracket after inserting the bracket into an inside of the housing, with the bracket attached with the flexible display device and an electronic part mounted therein, and closing the open ends of the housing with covers.

According to an example embodiment of the present disclosure, a housing may comprise a glass tube. Thus, the housing may be formed into a desired shape by processing the glass tube.

According to an example embodiment of the present disclosure, a stretchable bracket structure may be implemented inside the housing and be configured to come in tight contact with the housing.

According to an example embodiment of the present disclosure, covers are fit into the two open ends of the tubular glass housing, preventing and/or reducing the housing from external impacts while allowing a better look in light of design.

According to an example embodiment of the present disclosure, the flexible display device may correspond in shape to the tubular glass housing, providing a wider screen.

Other aspects, advantages, and salient features of the disclosure will become apparent to those skilled in the art from the following detailed description, which, taken in conjunction with the annexed drawings, discloses various example embodiments of the disclosure.

BRIEF DESCRIPTION OF THE DRAWINGS

The above and/or other aspects, features and attendant advantages of the present disclosure will become apparent and more readily appreciated from the following detailed description, taken in conjunction with the accompanying drawings, in which like reference numerals refer to like elements, and wherein;

FIGS. 20, 21, 22A, 22B and 22C are diagrams illustrating an example process for separately processing a glass tube and then attaching, according to an example embodiment of the present disclosure.

Throughout the drawings, like reference numerals will be understood to refer to like parts, components, and structures.

DETAILED DESCRIPTION

Figure 1A:
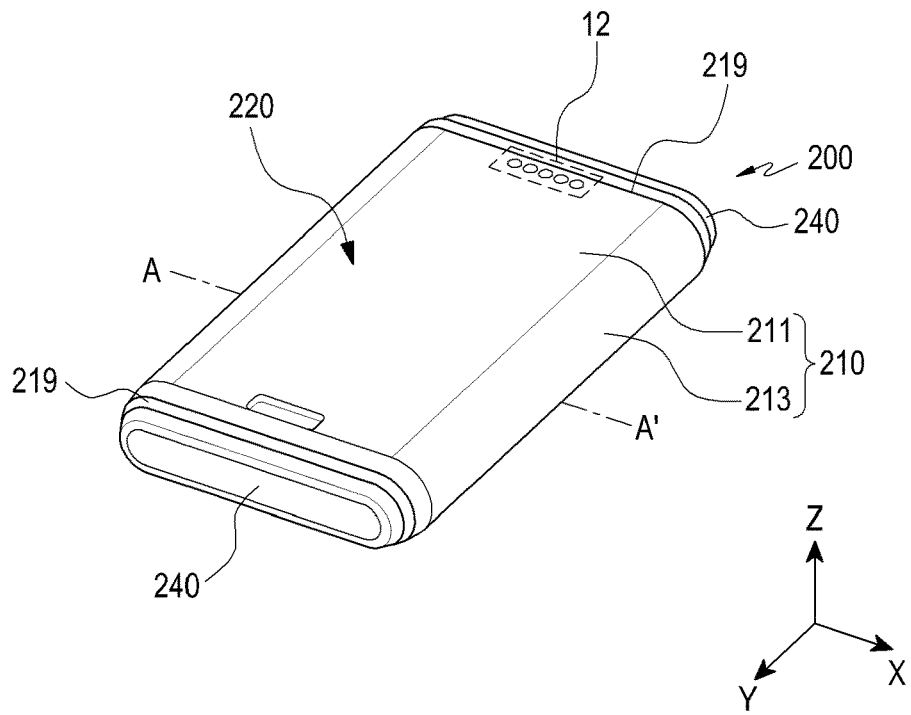
FIG. 1A is a perspective view illustrating an example electronic device 200 according to an example embodiment of the present disclosure.

Hereinafter, various example embodiments of the present disclosure are described in greater detail with reference to the accompanying drawings. However, it should be appreciated that the present disclosure is not limited to the various example embodiments and the terminology used herein, and all changes and/or equivalents or replacements thereto also fall within the scope of the present disclosure. The same or similar reference denotations may be used to refer to the same or similar elements throughout the specification and the drawings.

It is to be understood that the singular forms "a," "an," and "the" include plural references unless the context clearly dictates otherwise. As used herein, the terms "A or B" or "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware and/or software in context. The term "configured to" may refer to a situation in which a device can perform an operation together with another device or parts. For example, the term "processor configured (or set) to perform A, B, and C" may refer, for example, and without limitation, to a generic-purpose processor (e.g., a CPU or application processor) that may perform the operations by executing one or more software programs stored in a memory device or a dedicated processor (e.g., an embedded processor) for performing the operations, or the like.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device, or the like, but is not limited thereto. In some embodiments, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame, or the like, but is not limited thereto.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler), or the like, but is not limited thereto. According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves), or the like, but is not limited thereto. According to embodiments of the present disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

Figure 1B:
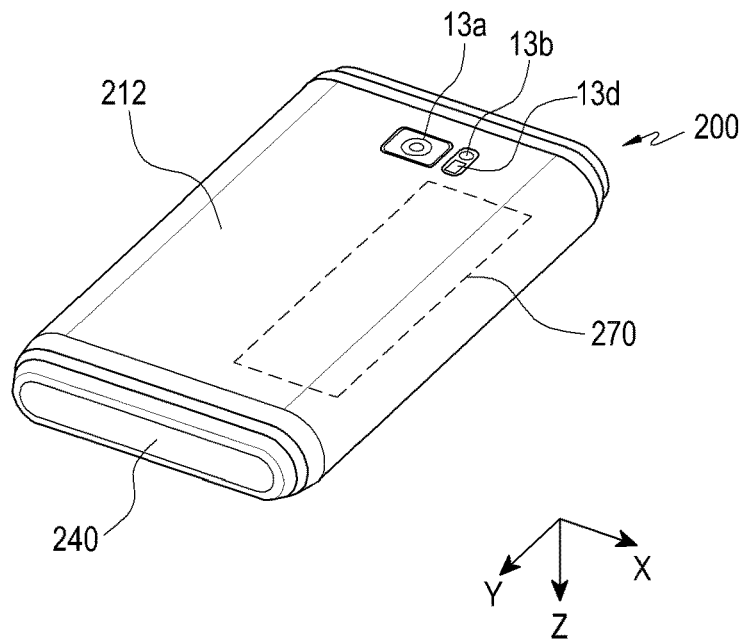
FIG. 1B is a perspective view illustrating the electronic device of FIG. 1A viewed in a different direction according to an example embodiment of the present disclosure.

FIG. 1A is a perspective view illustrating an example electronic device 200 according to an example embodiment of the present disclosure. FIG. 1B is a perspective view illustrating the electronic device of FIG. 1A viewed in a different direction.

In the three-axis rectangular coordinate system as illustrated in FIGS. 1A and 1B, 'X,' 'Y,' and 'Z,' respectively, may denote the width, length, and height direction of the electronic device 200. As used herein, "first direction (+Z)" may refer to a direction perpendicular to a front surface, and "second direction (–Z)" may refer to an opposite direction of "first direction (+Z)."

Referring to FIGS. 1A and 1B, the electronic device 200 may include a housing 210 and a display device 220.

According to an embodiment of the present disclosure, the housing 210 may include a first surface 211 including a flat surface, a second surface 212 facing the first surface 211, and a third surface 213 that extends from the first surface 211 or the second surface 212 and forms curved surfaces. For example, the first surface 211 of the housing 210 may be disposed to face in the first direction +Z, and the second surface 212 may be disposed to face in the second direction –Z which is opposite to the first direction +Z. As another example, the third surface 213 of the housing 210 may include curved surfaces that extend from the first surface 211 to the second surface 212 in the opposite sides of the housing 210 and that are disposed in a third direction X.

According to an embodiment of the present disclosure, the overall surface (e.g., the first surface 211, the second surface 212, and the third surface 213) of the housing 210 may comprise a light-transmitting material. As another example, the housing 210 may comprise, at least partially, a conductive material to retain metallic characteristics, and another portion of the housing 210 may comprise a light-transmitting material, such as glass.

According to an embodiment of the present disclosure, where the housing 210 is formed overall of a transparent (or at least partially translucent) material, the transparent housing 210 may include, e.g., a transparent material, such as glass or plastic.

According to an embodiment of the present disclosure, the housing 210 may be made in the form of a glass tube. The glass tube may be formed, for example, and without limitation by extrusion. The glass tubular housing 210 may be formed of reinforced glass and a material with radio wave transmittance enabling wireless communication.

As another example, at least a portion of the housing 210 may be formed to be opaque. For example, the portion of the housing 210 other than where the display device 220 is disposed may be formed to be opaque by an ink printing process, and this portion may be covered by an opaque metal or plastic.

According to an embodiment of the present disclosure, the electronic device 200 may include a keypad (not shown) with physical or mechanical buttons or touch keys on a side portion of the housing 210 on the front surface of the housing 210. The keypad may generate input signals as they are touched by the user's body. According to an embodiment of the present disclosure, the keypad may be implemented to include only mechanical buttons or only the touch keys. As another example, the keypad may be implemented in a mixed type of the mechanical button type and the touch type. The keypad may provide various screens on the display corresponding to a shorter or longer press or touch on the buttons.

According to an embodiment of the present disclosure, the housing 210 may be an element for receiving various electronic parts. At least part of the housing 210 may be formed of a conductive material. The printed circuit board and/or a battery 270 may be received inside the housing 210. For example, a processor, a communication module, various interfaces, or a power management module may be mounted on the printed circuit board in the form of an integrated circuit (IC) chip. For example, a control circuit may also be configured in an IC chip and mounted on the printed circuit board. For example, the control circuit may be part of the processor or the communication module. The housing 210 embeds the battery 270 to secure power.

According to an embodiment of the present disclosure, electronic parts 12, e.g., a camera, which are exposed to the outside of the electronic device 200, may be arranged on an upper portion of the first surface 211 of the electronic device 200. For example, a front camera, a light source unit, and an iris camera may be included in the electronic parts 12. The light source unit may be an infrared (IR) light emitting diode (LED). The iris camera may take an image of the user's eye using, as a light source, near infrared light emitted from the IR LED, thereby recognizing iris information. As another example, the electronic parts 12 of the electronic device 200 may also include a light source indicating light, an illuminance sensor, or a proximity sensor. As another example, a rear camera 13a, a heart rate sensor (or heart rate monitor (HRM)) 13d or a flash 13b may be provided on the rear surface 240 of the electronic device 200. A microphone (not shown) may be provided on an upper portion of the electronic device 200.

According to an embodiment of the present disclosure, the housing 210 may be made in the form of a tube having two open ends. The two open ends allows the display device 220 and various electronic parts mounted in the bracket (e.g., the brackets 330a and 330b of FIGS. 2 and 3) to be inserted. The bracket, electronic parts, and display device 220, after inserted into the housing 210, may be closed by the cover 240 (which is described below in detail with reference to FIG. 4).

According to an embodiment of the present disclosure, each end 219 of the housing 210 may form a curved surface with a predetermined curvature. For example, the outer circumference of each end 219 of the housing 210 may be formed to be smaller than the outer circumference of the middle portion of the housing 210. Each end 219 of the housing 210 may be formed to have the same curvature as an end of each of a plurality of covers 240, presenting a better look in design and convenience in grip. The two ends 219 of the housing 210 each may have a different curvature from the other, and the two ends 219 may be formed to have different inclined surfaces according to the different curvatures.

According to an embodiment of the present disclosure, the display device 220 may be exposed through at least a surface of the housing 210. For example, the overall surface (e.g., the first surface 211, the second surface 212, and the third surface 213) of the housing 210 may be formed transparent, and a screen from the display device 220 may be outputted to the overall surface. To provide visual content to the overall surface, the display device 220 may be a flexible display device. The flexible display device 220 may display visual content in the form of continuous loops. As another example, an image displayed on the display device 220 may continuously be displayed in the first direction +Z perpendicular to the display device 220 and the third direction X perpendicular to the first direction +Z.

According to an embodiment of the present disclosure, at least part (e.g., the first surface 211, the second surface 212, or the third surface 213) of the overall surface of the housing 210 may be formed to be transparent, allowing the screen provided from the display device 220 to be output therethrough.

According to an embodiment of the present disclosure, the display device 220 may at least partially be formed of a material capable of transmitting radio waves or electromagnetic fields, and the display device 220 may be mounted on at least one surface of the housing 210. The display device 220 may include a display panel that is mounted on an inner surface of the light-transmitting housing 210 formed of reinforced glass. A touch panel may be disposed between the housing 210 and the display panel. For example, the display device 220 may be utilized as an input device equipped with touchscreen functionality, not alone as an output device for outputting screen.

According to an embodiment of the present disclosure, the electronic device 200 may include a dielectric layer that is disposed between the display device 220 and the housing 210 to attach the display device 220 with the housing 210. The dielectric layer may be disposed in contact with the light transmissive housing 210. The dielectric layer may include, e.g., silicone, air, a foam, a membrane, an optical clear adhesive (OCA), sponge, rubber, ink, or a polymer (e.g., polycarbonate (PC) or PET). According to an embodiment of the present disclosure, the display device 220 may include an optical layer (not shown). The optical layer may be disposed on the rear surface of the dielectric layer. According to an embodiment of the present disclosure, the optical layer may be a layer to transmit a screen outputted from the display panel. At least one optical layer may be layered on the display panel. For example, the optical layer may include an optical compensation film to calibrate, e.g., the phase difference of the screen outputted from the display panel. As another example, when the display device has touchscreen capability, the optical layer may be an indium-tin-oxide (ITO) film to sense, e.g., the position of the user's contact. According to an embodiment of the present disclosure, the optical layer may include an optical compensation film, e.g., a polarizing film.

Figure 2:
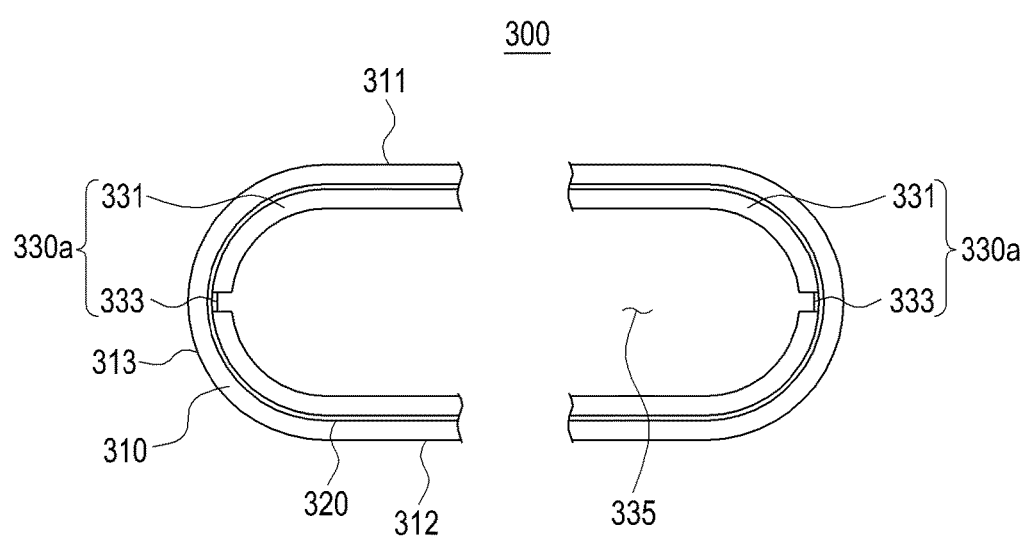
FIG. 2 is diagram illustrating a cross-sectional view taken along line A-A' of FIG. 1.
Figure 3:
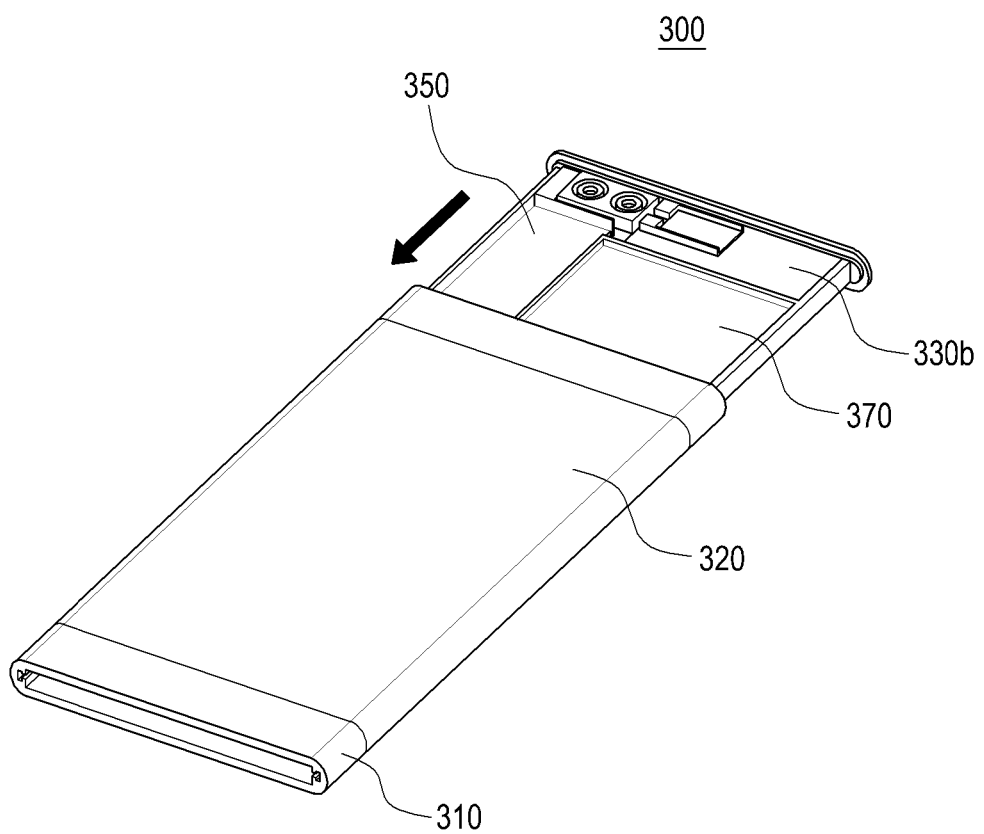
FIG. 3 is a perspective view illustrating an example inner bracket structure and parts of an electronic device according to an example embodiment of the present disclosure.

FIGS. 2 and 3 are diagrams illustrating example electronic parts mounted on a first bracket 330a and a second bracket 330b inside an electronic device according to an example embodiment of the present disclosure.

FIG. 2 is a cross-sectional view taken along line A-A' of FIG. 1, according to an example embodiment of the present disclosure. Referring to FIG. 2, the housing 310, display 320, may, respectively correspond the housing 210 and display device 220 of FIG. 1.

Referring to FIGS. 2 and 3, the electronic device 300 may include a first bracket 330a that is disposed inside the tubular housing 310, is shaped to correspond to the housing 310, and has two open ends and a second bracket 330b inserted into the inside of the first bracket 330a.

According to an embodiment of the present disclosure, the first bracket 330a may be formed of a metal or plastic, and the first bracket 330a may be attached to the display device 320 by way of an adhesive. For example, the first bracket 330a may be made in the form of a tube corresponding in shape to the light-transmitting housing.

According to an embodiment of the present disclosure, the first bracket 330a may include an inner space 335 where a printed circuit board 350 (e.g., the printed circuit board 250 of FIG. 2), a battery 370 (e.g., the battery 270 of FIG. 2), or other various electronic parts are mounted. The display device 320 may be attached to an outer surface of the first bracket 330a by an adhesive.

According to an embodiment of the present disclosure, the flexible display device 320 may be disposed to surround the first bracket 330a. For example, the flexible display device 320 may be formed to have a tube shape with two ends contacting each other, allowing the display device 320 to correspond in shape to the first bracket 330a. The tubular flexible display device 320 may externally display visual information in a continuous manner along the closed loop shape.

According to an embodiment of the present disclosure, the first bracket 330a may include a plurality of frames 331 formed to have a fixed shape and a length-adjustable adjusting member 333 disposed between the plurality of frames 331. For example, the plurality of frames 331 each may be shaped as a plate corresponding to one of the first surface 311 or the second surface 312 of the housing 310 or a plate including a curved shape corresponding to the third surface 313 of the housing 310. As another example, the adjusting member 333 may include a structure expandable in multiple directions.

According to an embodiment of the present disclosure, the first bracket 330a may be structured to have four segments. Such segmental structure may firmly hold the first bracket 330a and the display device 320 in tight contact with the inside of the housing 310. For example, the electronic device 300 may be manufactured in such a process as to join the first bracket 330a with the inner surface of the housing 310 by suction after inserting the first bracket 330a, with the display device 320 included therein, into the inside of the housing 310.

According to an embodiment of the present disclosure, the housing 310, the display device 320, and the first bracket 330a may form the same tube structure, and they may the same center. In the electronic device 300, the display device 320 and the first bracket 330a may sequentially be layered on the inner surface of the housing 310.

According to an embodiment of the present disclosure, a dielectric layer may be disposed between the housing 310 and the display device 320 to join the housing 310 and the display device 320. For example, the dielectric layer may include silicone, air, a foam, a membrane, an OCA, sponge, rubber, an ink, or a polymer (e.g., PC or PET). An adhesive layer may be disposed between the display device 320 and the first bracket 330a to join the display device 320 and the first bracket 330a.

According to an embodiment of the present disclosure, the second bracket 330b disposed in the inner space 335 of the first bracket 330a may have various electronic parts mounted inside, and the electronic parts may include the printed circuit board 350 and the battery 370.

According to an embodiment of the present disclosure, the second bracket 330b, along with the first bracket 330a, may prevent and/or reduce integrated circuit (IC) chips mounted on the printed circuit board 350 from contacting the display device 320 and may function as an electromagnetic shield, preventing and/or reducing electromagnetic interference between the IC chips.

According to an embodiment of the present disclosure, the second bracket 330b may reinforce the hardness of the electronic device 300. For example, the two end openings for placing the internal electronic parts or holes and/or recesses for a camera or sensors which are formed in the tubular housing 310 may deteriorate the hardness of the housing 310 or the electronic device 300. The second bracket 330b may be provided in the first bracket 330a and/or housing 310, increasing the hardness of the housing 310 or the electronic device 300.

Although not shown in the drawings, according to an embodiment of the present disclosure, various structures may be formed on the outer and inner surface of the housing 310 depending on the arrangement of electronic parts inside the electronic device 300 or connections between the housing 310 and the second bracket 330b. For example, the second bracket 330b may have a space for receiving each of the IC chips mounted on the printed circuit board 350. The spaces for the IC chips may be formed in recessed shapes or ribs surrounding the IC chips.

According to an embodiment of the present disclosure, the printed circuit board 350 disposed inside the second bracket 330b may have a circuit of the terminal, e.g., at least one of an application processor (AP), a communication processor (CP), a memory, and a radio frequency (RF) transceiver, mounted thereon, and the printed circuit board 250 may include a signal line (e.g., a RF signal line). According to an embodiment of the present disclosure, power may be secured by placing the battery 370 in a mounting hole 215 that is provided inside the second bracket 330b.

Now described in greater detail is a segmental structure for the first bracket 330a.

Figure 4:
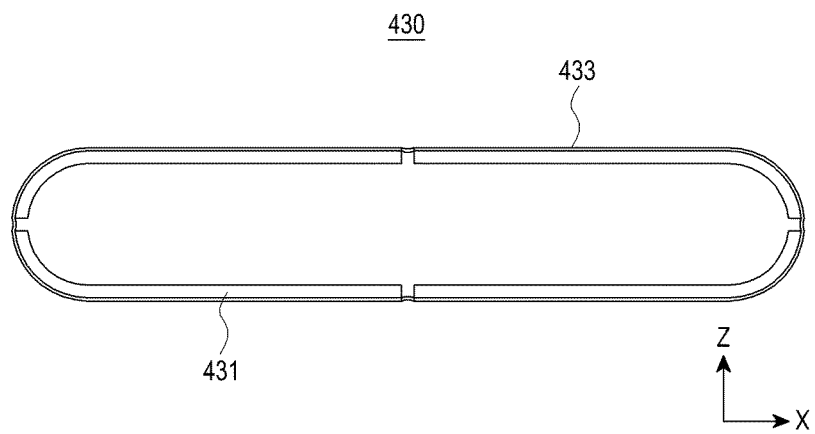
FIG. 4 is a diagram illustrating an example segmental bracket 430 according to an example embodiment of the present disclosure.
Figure 5:
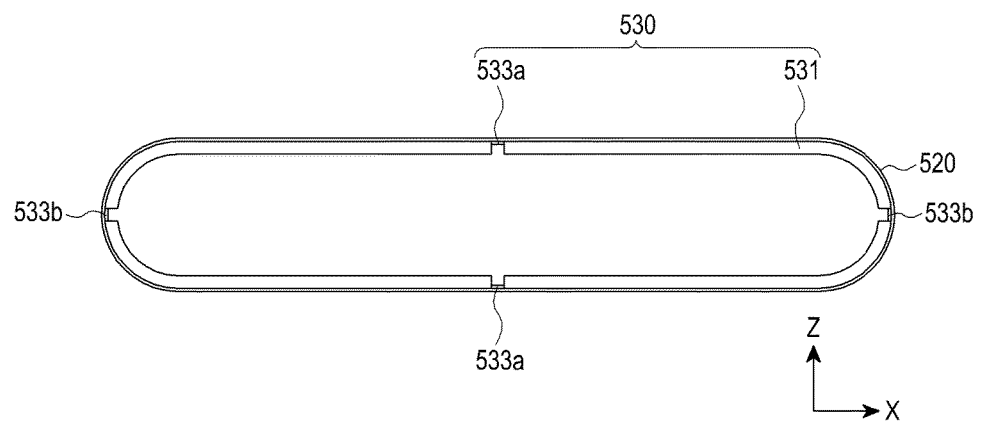
FIG. 5 is a diagram illustrating an example segmental bracket 530 and an arrangement of the bracket 530 and a display device 520 according to an example embodiment of the present disclosure.

FIG. 4 is a diagram illustrating an example segmental bracket 430 according to an example embodiment of the present disclosure. FIG. 5 is a diagram illustrating an example segmental bracket 530 and an arrangement of the bracket 530 and a display device 520 according to an example embodiment of the present disclosure The brackets 430 and 530 and the display device 520 of FIGS. 4 and 5 may be the bracket and the display device 320, respectively, of FIG. 3.

Referring to FIG. 4, the electronic device may include a bracket 430 having a plurality of frames 431 and at least adjusting member 433. According to an embodiment of the present disclosure, the bracket 430 may be formed of a tube that has the frames 431 coupled together and each of which, at least partially, has a curved surface. The coupling of the frames 431 may be made by the adjusting member 433.

According to an embodiment of the present disclosure, the bracket 430 may be configured to have four segmental frames. Each end of each segmental frame 431 may be connected with an end of the adjacent segmental frame 431 by the adjusting member 433. The adjusting member 433 may be formed to surround the plurality of frames 431 along the outer surface of the frames 431, and the adjusting member 433 may include a stretchable material shaped as a closed loop.

According to an embodiment of the present disclosure, the adjusting member 433 may be adjusted for its length in the first direction +Z or the second direction −Z. According to an embodiment of the present disclosure, the adjusting member 433 may be length-adjusted along the third direction X which is perpendicular to the first direction +Z. As the adjusting member 433 is expanded and/or contracted, so may the overall bracket 430. By so doing, the bracket 430 may be brought in tight contact and firmly fastened onto the inner surface of the housing.

Referring to FIG. 5, according to an embodiment of the present disclosure, the electronic device may include a bracket having a plurality of frames 531 and a plurality of adjusting members 533.

According to an embodiment of the present disclosure, the bracket 530 may be configured to have four segmental frames. Each end of each segmental frame 531 may be connected with an end of the adjacent segmental frame 431 by the adjusting member 533. For example, the adjusting members 533 may include a first adjusting member 533a and a second adjusting member 533b. The first adjusting member 533a and the second adjusting member 533b may be disposed between the frames 531. The first and second adjusting members 533a and 533b may include an elastic material.

According to an embodiment of the present disclosure, at least a pair of first adjusting members 533a, which face each other, may be provided. At least a pair of second adjusting members 533b may be provided that are arranged to face each other in a direction different from the direction along which the first adjusting members 533a are arranged. The first adjusting members 553a may be length-adjustable in the first direction +Z or the second direction −Z, and the second adjusting members 553b may be length-adjustable in the third direction X perpendicular to the first direction +Z. As the adjusting member 533 is expanded and/or contracted, so may the overall bracket 530. Thus, the bracket 530 and the display device 520 disposed on the outer surface of the bracket 530 may be brought in tight contact and firmly fastened onto the inner surface of the housing.

According to an embodiment of the present disclosure, the electronic device may have the display device 520 disposed on the outer surface of the bracket 530. For example, the flexible display device 520 may be disposed to wrap around the overall outer surface of the tubular bracket 530 in contact with the tubular bracket 530. An adhesive may be provided between the outer surface of the bracket 530 and the flexible display device 520 to join the bracket 530 with the flexible display device 520. For example, the adhesive may include a light-cured resin layer. The light-cured resin may be a photosensitizer that is instantaneously cured, dried, or attached when irradiated with an ultraviolet (UV) beam. The processes of curing, drying, and attaching may simultaneously be performed by applying the light-cured resin and radiating UV light with a short wavelength causing a chemical reaction. The light-cured resin may be changed in structure responsive to the flexible structure of the housing and display device 520, advantageously enabling joining.

Although the bracket 530 is illustrated and described herein to have four curved segmental plates or frames, the structure of the bracket 530 is not limited thereto, and other various types plates or segmental structures may be provided in various numbers or positions to expand or shrink the bracket 530 in an effective manner.

Figure 6A:
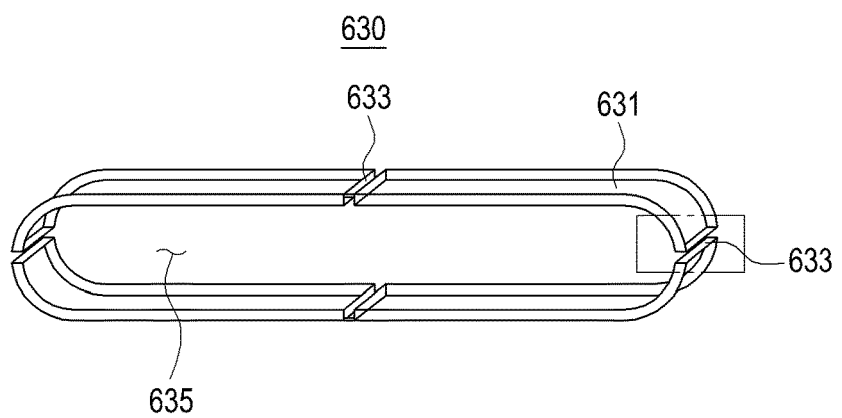
FIG. 6A is a perspective view illustrating an example segmental bracket 630 according to an embodiment of the present disclosure.
Figure 6B:
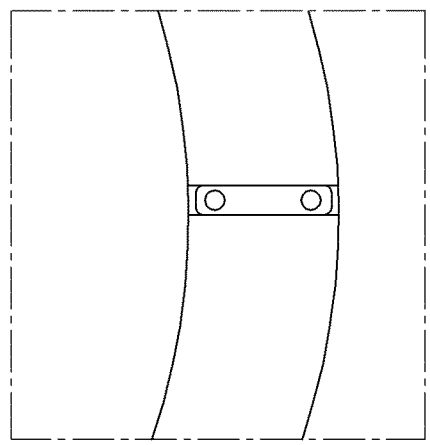
FIGS. 6B and 6C are cross-sectional views illustrating an example adjusting member 633 of the bracket 630 of FIG. 6A.
Figure 6C:
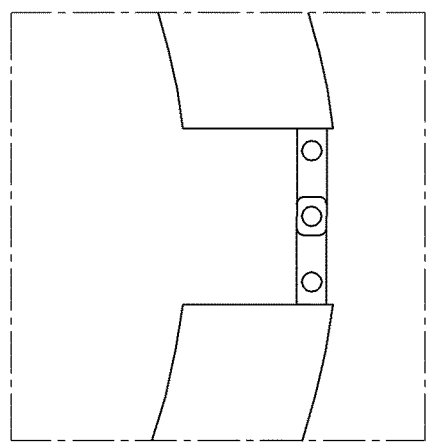

FIG. 6A is a perspective view illustrating an example segmental bracket 630 according to an example embodiment of the present disclosure. FIGS. 6B and 6C are cross-sectional views illustrating an example adjusting member 633 of the bracket 630 of FIG. 6A. The bracket 630 of the electronic device as shown in FIGS. 6A, 6B and 6C may be the same in structure as the first bracket 330*a* of FIG. 2.

Referring to FIGS. 6A, 6B and 6C, the electronic device may include a bracket 630 having a plurality of frames 631 and a plurality of adjusting members 633. According to an embodiment of the present disclosure, the bracket 630 may be formed of a tube that has the frames 631 coupled together and each of which, at least partially, has a curved surface. The coupling of the frames 631 may be made by the adjusting member 633.

According to an embodiment of the present disclosure, each adjusting member 633 may have a hinge structure. The hinge structure of the adjusting member 633 may be disposed between two adjacent frames 633 to couple them together.

FIG. 6B is a cross-sectional view illustrating the hinge structure in a contracted state where the hinge structure enables the bracket 630 to have a minimum circumference. For example, in the contracted state, electronic parts may be mounted in the inner space 635 of the bracket 630, and a display device (the display device 320 of FIG. 3) may be disposed on the outer surface of the bracket 630.

FIG. 6C is a cross-sectional view illustrating the hinge structure in an expanded state where the hinge structure enables the bracket 630 to have a maximum circumference. For example, after the display device is placed in the bracket 630, the bracket 630 may be inserted into the housing and may then be attached to the inner surface of the housing by suction through the hole of the housing. The suction allows the bracket 630 to expand according to the hinge structure.

As such, the bracket 630 is stretchable by expanding or contracting the hinge-structured adjusting members 633, and thus, the bracket 630 and the display device disposed on the outer surface of the bracket 630 may firmly be fastened onto the inner surface of the housing.

Figure 7A:
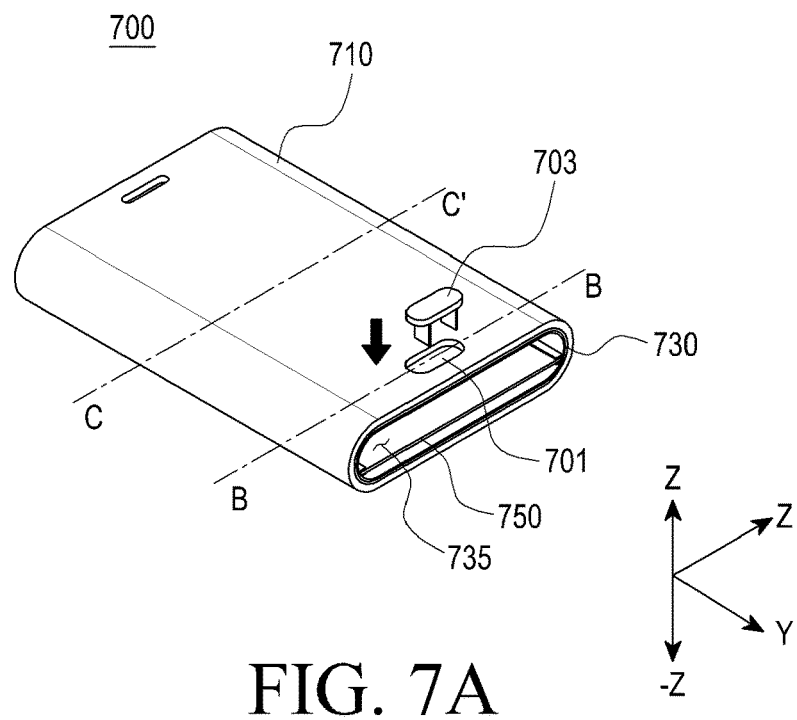
FIG. 7A is a perspective view illustrating an example structure for supporting a printed circuit board 750 inside a bracket 730 in an electronic device and an example in which a keypad is mounted according to an example embodiment of the present disclosure.
Figure 7B:
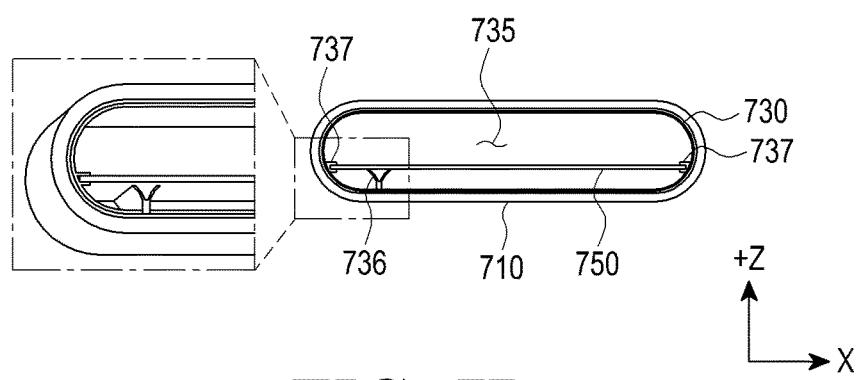
FIG. 7B is a cross-sectional view taken along line B-B' of FIG. 7A.
Figure 7C:
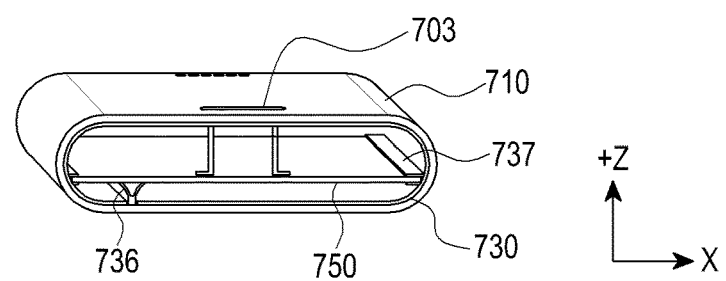
FIG. 7C is a cross-sectional view taken along line C-C' of FIG. 7A.

FIG. 7A is a perspective view illustrating an example structure for supporting a printed circuit board 750 inside a bracket 730 in an electronic device and an example in which a keypad is mounted according to an example embodiment of the present disclosure. FIG. 7B is a cross-sectional view taken along line B-B' of FIG. 7A; FIG. 7C is a cross-sectional view taken along line C-C' of FIG. 7A. The housing 710 and bracket 730 of the electronic device 700 as illustrated in FIGS. 7A, 7B and 7C may be the same in structure as the housing 310 and first bracket 330*a*, respectively, of FIG. 2.

Referring to FIG. 7A, a flexible display device-mounted bracket 730 may be placed in the electronic device 700. A printed circuit board 750 may be mounted in the inner space 735 of the bracket 730. The bracket 730 may include at least one supporting member 737 (see, e.g., FIGS. 7B and 7C) to firmly support the printed circuit board 750 in the inner space 735.

According to an embodiment of the present disclosure, the bracket 730 may include a connecting member 736 for connecting the printed circuit board 750 to the display device and the supporting member 737 for supporting the printed circuit board 750 on the side surface.

According to an embodiment of the present disclosure, a hole 701 may be formed in a portion of the front surface of the housing 710 to provide a keypad 703 with a physical or mechanical button or touch key. According to an embodiment of the present disclosure, after the printed circuit board 750-mounted bracket 730 is placed in the housing 710, the keypad 703 may be inserted through the hole 703 in the second direction −Z. The keypad 703 may contact the printed circuit board 750, forming an electrical connection.

FIG. 7B shows the connecting member 736 and the supporting members 737 inside the bracket 730.

According to an embodiment of the present disclosure, the connecting member 736 may be disposed on the rear inner surface of the bracket 730 to face in the first direction +Z to electrically connect the printed circuit board 750 with the display device. The connecting member 736 may be a flexible printed circuit board. The configuration of the connecting member 736 is not limited as disposed on the rear surface of the printed circuit board 750. According to an embodiment of the present disclosure, at least one or more connecting members 736 of various shapes may be provided on the front or rear surface of the printed circuit board 750 to make connections with the display device. The supporting members 737 may project from the inner surface of the bracket 730 in the third direction X perpendicular to the first direction +Z to support both sides of the printed circuit board 750. For example, the supporting members 737 may be arranged at two opposite sides inside the bracket 730, and each of the supporting members 737 may have a step or recess to fit over its corresponding side of the printed circuit board 750. The structure of each supporting member 737 is not limited thereto. Alternatively, the supporting members 737 may be provided in various shapes or numbers in the bracket 730 to provide a space for mounting electronic parts on the top and/or bottom of the printed circuit board 750.

FIG. 7C shows the connecting member 736, supporting members 737, printed circuit board 750, and keypad 703 in the bracket 730. According to an embodiment of the present disclosure, the keypad 703 may be disposed on the front surface of the housing 710 to enable entry of data information and delivery of an electrical signal to the inside of the electronic device to allowing the user to obtain her desired information. The keypad 703 may be fitted from the outside through the hole (the hole 701 of FIG. 7A) formed in the housing 710, and at least part of the keypad 703 may be connected with the printed circuit board 750. For example, the keypad may be formed of a dome button. The flexible printed circuit board 750 may convert a pressure transferred from the dome button into an electrical signal, assisting in the user's desired function. For example, the keypad may be formed of a touch pad. The flexible printed circuit board 750 may convert a pressure transferred from the touch pad into an electrical signal, assisting in the user's desired function. As another example, the keypad 703 may be disposed on a side and/or rear surface of the housing 710 and connect with the printed circuit board to delivery electrical signals.

Figure 8A:
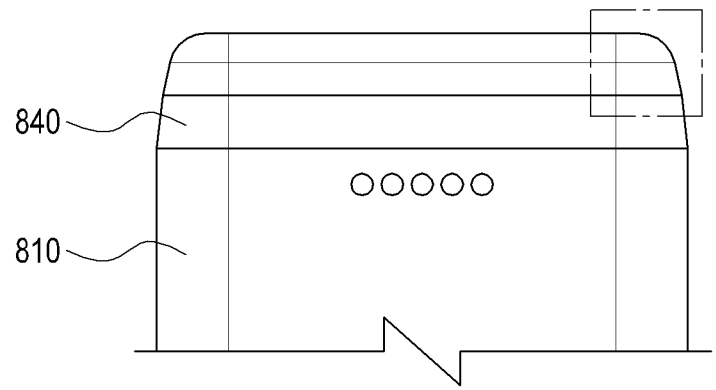
FIG. 8A is a front view illustrating an example cover 840 coupled to a housing 810 of the electronic device according to an example embodiment of the present disclosure.
Figure 8B:
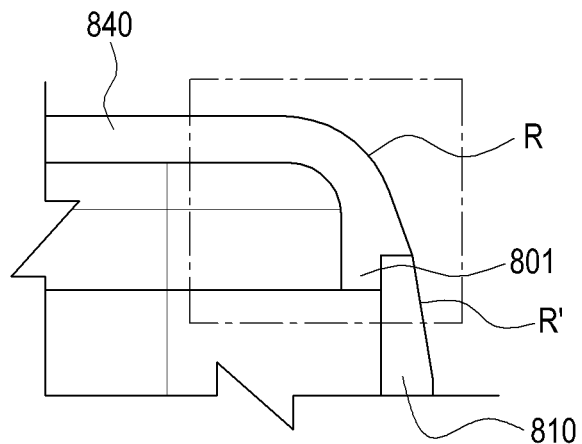
FIG. 8B is an expanded view illustrating a portion of the cover 840 according to an example embodiment of the present disclosure.

FIG. 8A is a front view illustrating an example cover 840 coupled to a housing 810 of the electronic device according to an example embodiment of the present disclosure. FIG. 8B is an expanded view illustrating a portion of the cover 840 according to an example embodiment of the present disclosure. The housing 810 and cover 840 of the electronic device 800 as illustrated in FIGS. 8A and 8B may be the housing 210 and cover 240, respectively, of FIG. 1.

Referring to FIGS. 8A and 8B, the electronic device 800 may include a plurality of covers 840 disposed on the top and bottom of the housing 810.

According to an embodiment of the present disclosure, the covers 840 may be formed of caps that may close the top and bottom openings of the housing 810. The covers 840 may include a first cover 840 disposed at the top and a second cover (not shown) disposed at the bottom. The first cover 840 and the second cover may be shaped to correspond to the top and bottom, respectively, of the housing 810.

According to an embodiment of the present disclosure, the first cover 840 may have a first step 801 that may, at least partially, be inserted into the top of the housing 810. For example, the first step 801 may be fitted into a stepped portion of the housing 810, and the first step 801 and the end of the housing 810 may be joined together by bonding or using an adhesive film. As another example, the second cover may have a second step that may, at least partially, be inserted into the bottom of the light-transmitting housing 810. For example, the second step may be fitted into a stepped portion of the housing 810, and the second step and the end of the housing 810 may be joined together by bonding or using an adhesive film. The first cover 840 and the second cover (not shown) may have the same shape.

According to an embodiment of the present disclosure, the cover 840 may be formed of a material different from the housing 810. The cover 840 may include a rigid, elastic material to prevent and/or reduce the likelihood that the electronic device 800 being broken, e.g., upon dropping. The cover 840 may include a soft material, e.g., at least one of thermoplastic polyurethane (TPU), thermoplastic silicone vulcanizate (TPSiV), or silicone.

According to an embodiment of the present disclosure, the cover 840 may be shaped to give a uni-body look along with the housing 810. For example, the housing 810 may have a curved and/or slopping surface with a predetermined curvature R in each end edge as set forth above. Corresponding to such structure of the housing 810, a lower portion of each cover 840 which is fitted to the end of the housing 810 may be formed to have a curved and/or slopping surface with the same curvature R' as the curvature R of the housing. Accordingly, the covers and the housing may be fitted together seamlessly and evenly, allowing the electronic device 800 a better look.

Now described in greater detail below, is a process for manufacturing an electronic device.

FIGS. 9 to 16 are views illustrating an example process for manufacturing an electronic device according to an example embodiment of the present disclosure. The electronic device of FIGS. 9 to 16 may be the same in structure as the electronic device 200 of FIGS. 1A and 1B.

Figure 9:
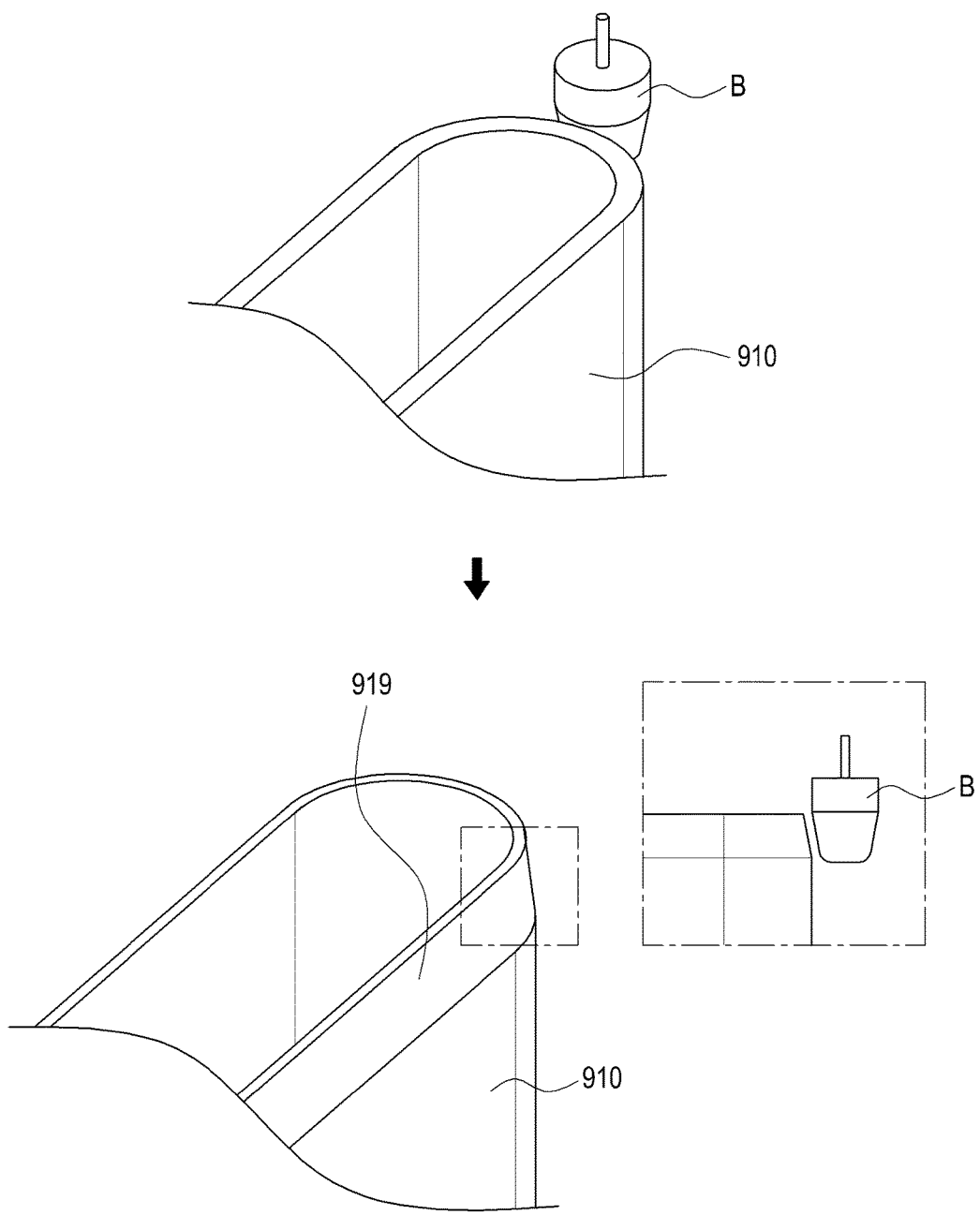
FIG. 9 is a diagram illustrating an example process for forming an outer edge portion of a tube-shaped housing 910 according to an example embodiment of the present disclosure.

FIG. 9 is a diagram illustrating an example process for an outer edge portion of a tube-shaped housing 910 according to an example embodiment of the present disclosure. As set forth above, the housing 910 may be manufactured by a process commonly known, e.g., extrusion. The housing 910 may be formed to have openings in the ends, and the housing 910 may include a transparent material, e.g., glass or plastic. For example, the housing 910 may be formed of a glass tube.

According to an embodiment of the present disclosure, the housing 910 may be formed to have the end outer edges 919 inclined to have a predetermined curvature to present a better design look and gripping convenience in operation 10. For example, the outer surface of both the ends of the light-transmitting housing 910 may be formed in a 2.5D edge shape using a ball bite B. The ball bite B may perform such a process on the edge 919 of each end of the light-transmitting housing 910 as to form continuous loops. Although FIG. 9 illustrates only the upper portion of the light-transmitting housing 910, the same process may also be performed on the lower portion, and the upper and lower portions may be formed to have different curvatures R depending on the user's preference.

Figure 10:
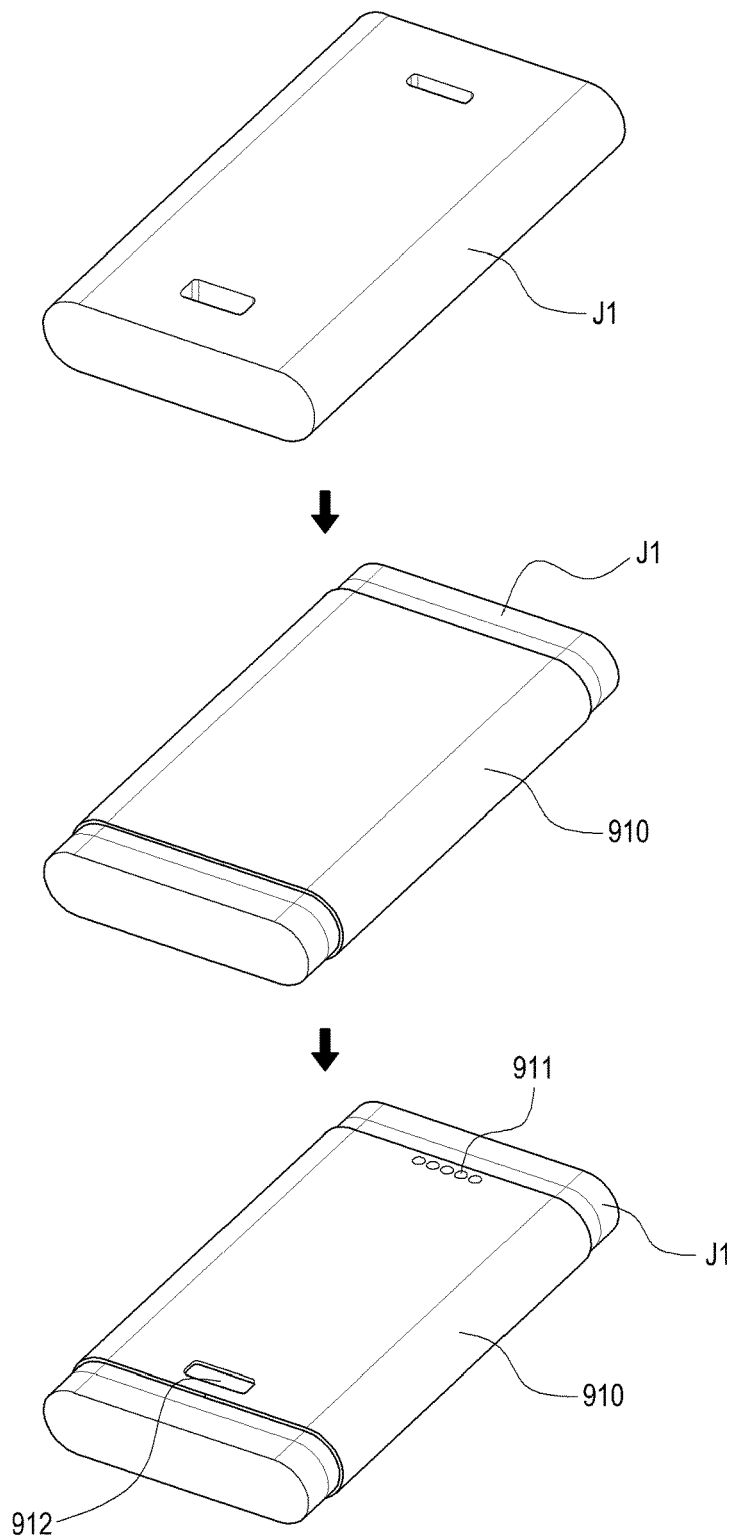
FIG. 10 is a diagram illustrating an example process for forming a hole of the housing 910 according to an example embodiment of the present disclosure.

FIG. 10 is a diagram illustrating an example process for forming a hole of the housing 910 according to an example embodiment of the present disclosure. A plurality of holes 911 and 912 may be formed in the housing 910 to expose at least some of, e.g., a button, camera, or sensor disposed inside.

Referring to FIG. 10, a hole computer numerical control (CNC) jig J1 may be prepared to set the position of the holes in the housing 910. The hole CNC jig J1 has holes corresponding to where holes for the housing 910 are to be formed in the outer surface of the housing 910. The hole CNC jig J1 may be shaped as a cylinder having an inner diameter corresponding to an outer diameter of the housing 910 to allow the housing 910 to be placed therein.

According to an embodiment of the present disclosure, the housing 910 is loaded and fitted into the hole CNC jig J1 as illustrated in the middle figure of FIG. 10. Thereafter, holes 911 and 912 may be processed to be formed in the housing 910, corresponding in position to the holes formed in the hole CNC jig J1. The holes 911 formed in the upper portion of the front surface of the housing 910 may be ones for a camera, sensor, and/or light, and the hole 912 formed in the lower portion of the front surface of the housing 910 may be one for a mechanical or touch button, e.g., a home button. An additional hole(s) may be formed for, e.g., a rear camera, in the rear surface of the housing 910.

Figure 11A:
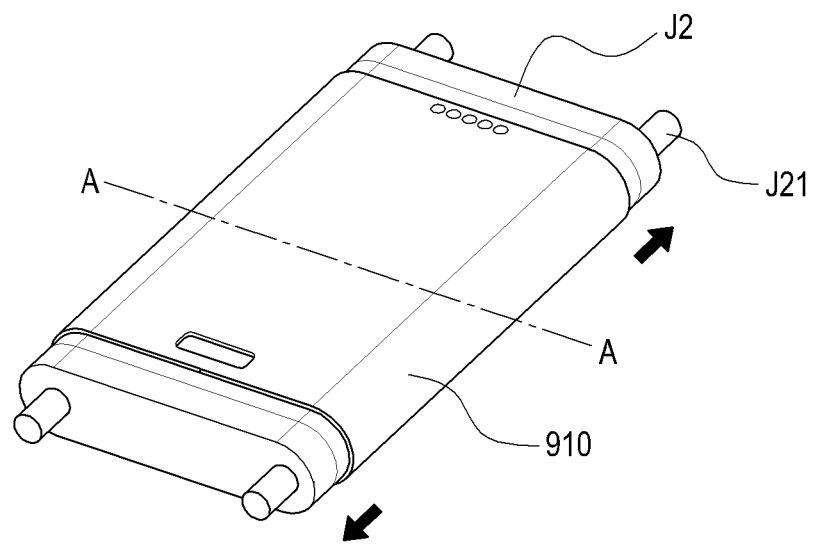
FIGS. 11A and 11B, are diagrams illustrating a perspective view and a cross-sectional view, respectively, illustrating an example process for polishing an inner surface of the housing 910 according to an example embodiment of the present disclosure.
Figure 11B:
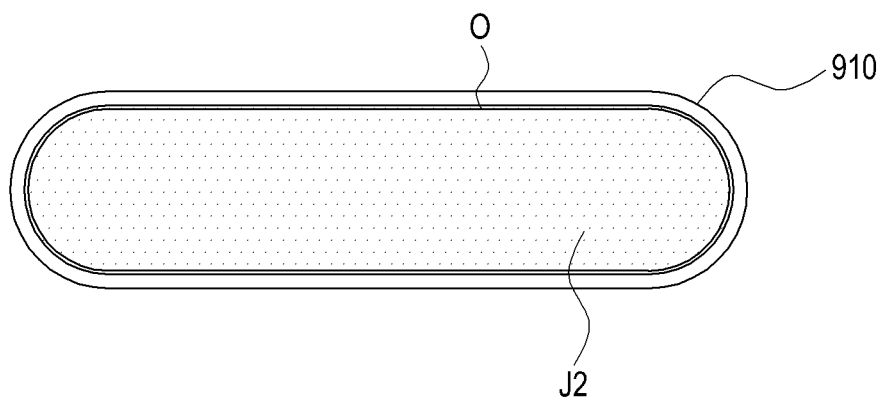

FIGS. 11A and 11B, respectively, are a perspective view and a cross-sectional view illustrating an example process for polishing an inner surface of the housing 910 according to an example embodiment of the present disclosure. The operations illustrated in FIG. 10 may leave, e.g., undesired substances or drawing marks, on the inner surface of the housing 910, causing the inner surface to be uneven or unclean. Since the bracket (the bracket 330*a* of FIG. 2) and the display device (e.g., the display device 220 of FIGS. 1A and 1B) are to be mounted on the inner surface of the housing 910, and the display device is to be attached onto the inner surface of the housing 910, the inner surface of the housing 910 is required to be clean.

Referring to FIG. 11A, a polishing pad J2 may be prepared to polish the inner surface of the housing 910. The polishing pad may be formed of a material including a cerium oxide powder. Guide rods J21 may be provided on the side surfaces of the polishing pad J2. Other various materials, e.g., zirconia, alumina, or diamonds, than the cerium oxide powder may also be adopted for the polishing pad J2 to effectively polish the inner surface of the housing 910.

According to an embodiment of the present disclosure, the polishing pad J2 may be shaped as a cylinder having an outer diameter corresponding to the inner diameter of the housing 910, allowing the polishing pad J2 to be seated in the housing 910.

According to an embodiment of the present disclosure, the polishing pad J2 may be loaded and fitted into the housing 910. Thereafter, the polishing pad J2 may be moved back and forth in the directions of the end openings of the housing 910, with the housing 910 fastened, polishing the inner surface of the housing 910.

FIG. 11B is a cross-sectional view taken along line B-B' of FIG. 11A. In the polishing operation, the housing 910 may be disposed on the outer surface of the polishing pad. As an example, the polishing pad and the housing 910 may be arranged to leave a gap O of about 0.5 mm therebetween.

Leaving the gap O allows the polishing to be done evenly over the entire inner surface of the housing 910.

Figure 12:
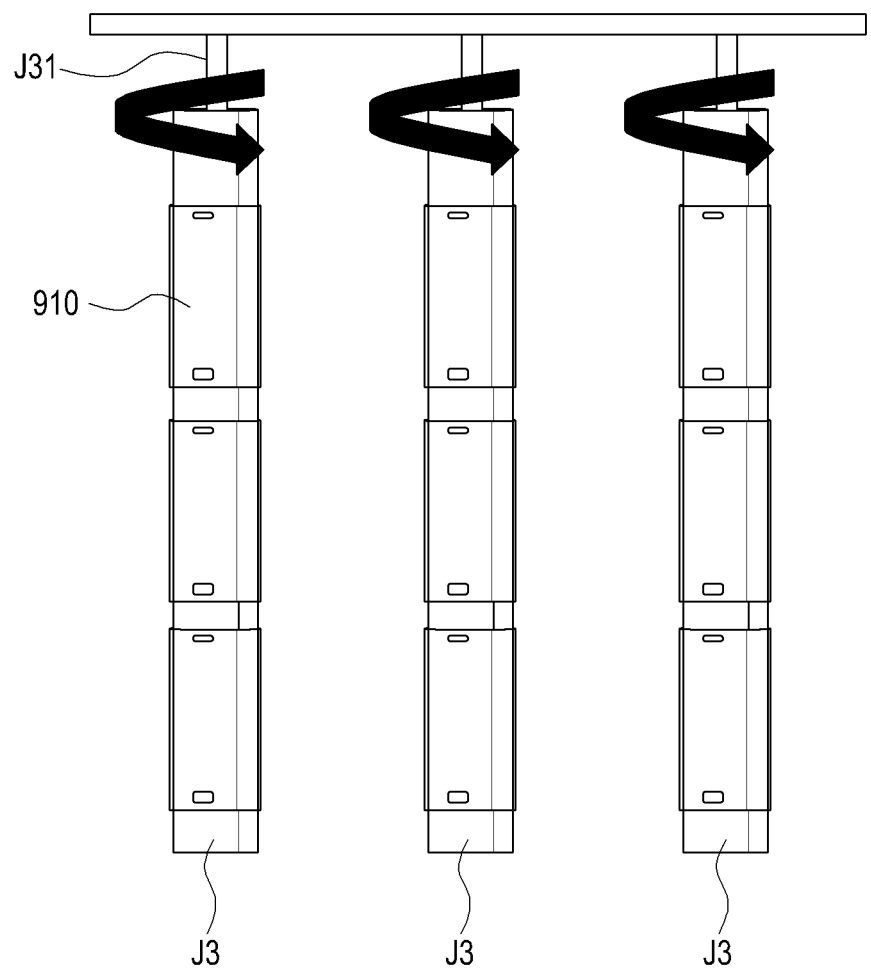
FIG. 12 is a perspective view illustrating an example process for coating an outer surface of the housing 910 according to an example embodiment of the present disclosure.

FIG. 12 is a perspective view illustrating an example process for coating an outer surface of the housing 910 according to an example embodiment of the present disclosure. The outer surface of the housing 910 requires a front coating to protect against scratches or external impacts. In this case, an anti-inner coating jig J3 needs to be provided to prevent and/or reduce the inner surface of the housing 910 from being coated and resultantly interrupting the attachment of the display device to the housing 910.

Referring to FIG. 12, a coating jig J3 may be prepared to allow the outer surface of the housing 910 to be coated while preventing and/or reducing the inner surface from being coated. The coating jig J3 may be manufactured in a form sized to be able to simultaneously coat a plurality of housings 910, and a rotation guide rod J31 may be provided on a side of the coating jig J3 to rotate the coating jig J3. The coating jig J3 connected with the rotation guide jig J31 may be rotated 360 degrees to coat the overall outer surface of each housing 910.

According to an embodiment of the present disclosure, the housing 910 may be loaded and fitted over the coating jig J3 in operation 40. Thereafter, the outer surface of the housing 910 fastened to the coating jig J3 may be coated while the coating jig J3 is rotated at 360 degrees. The coating may be performed, for example, by AF thermal sputtering. A plurality of housings 910 may simultaneously be processed by a single coating jig J3.

According to an embodiment of the present disclosure, the outer surface of the housing 910 may be, e.g., oleophobic-coated, leaving less fingerprint or other marks on the glass housing. As another example, the glass housing 910 may be anti-reflection coated, preventing and/or reducing glare, or may also be chemically reinforced to prevent and/or reduce, e.g., scratches. As still another example, the coated housing 910 may provide a silky surface, preventing and/or reducing the influx of contaminants or moisture into the inside of the device.

Figure 13:
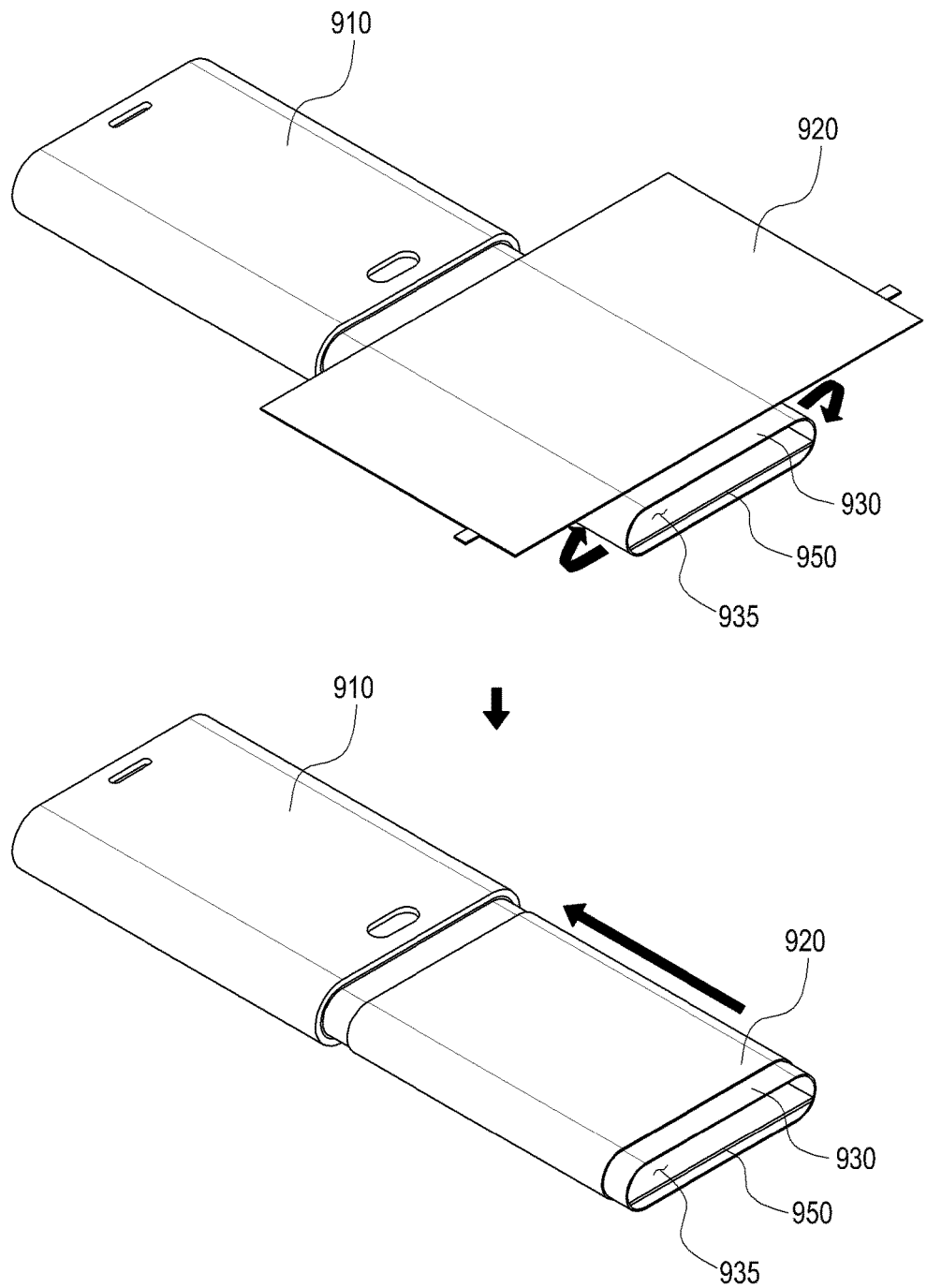
FIG. 13 is a diagram illustrating an example process for placing a flexible display device 920 in a bracket 930 and an example process for inserting the bracket 930 into the inside of the housing 910 according to an example embodiment of the present disclosure.

FIG. 13 is a diagram illustrating an example process for placing a flexible display device 920 in a bracket 930 and a process for inserting the bracket 930 into the inside the housing 910 according to an example embodiment of the present disclosure.

Referring to FIG. 13, the bracket 930 may be provided, and the display device 920 may be disposed on the outer surface of the bracket 930. According to an embodiment of the present disclosure, the bracket 930 may include a plurality of frames formed to have a fixed shape and length-adjustable adjusting members disposed between the plurality of frames. For example, the bracket 930 may be formed of a tube that has the frames coupled together and each of which, at least partially, has a curved surface. The coupling of the frames may be made by the adjusting members.

As an example, the adjusting members may be adjusted for its length in the first direction +Z or the second direction −Z. As another example, the adjusting members may be length-adjusted along the third direction X which is perpendicular to the first direction +Z. As the adjusting members are expanded and/or contracted, so may the overall bracket 930. By so doing, the bracket 930 may be brought in tight contact and firmly fastened onto the inner surface of the housing. A space 935 may be formed inside the bracket 930 to mount a printed circuit board 950, battery (not shown), or other various electronic parts.

For example, the flexible display device 920 may be attached onto the outer surface of the bracket 930 through an adhesive film. The flexible display device 920 may be disposed to surround the bracket 930 along the outer surface. For example, the flexible display device 920 may be formed to have a tube shape with two ends contacting each other, allowing the display device 920 to correspond in shape to the bracket. The tubular flexible display device 920 may externally display visual information in a continuous manner along the closed loop shape.

Thereafter, the display device 920-disposed bracket 930 may be loaded and inserted into the inside of the housing 910. For example, the display device 920-disposed bracket 930 may be shrunken by the adjusting members and inserted into the inside of the housing 910.

Figure 14A:
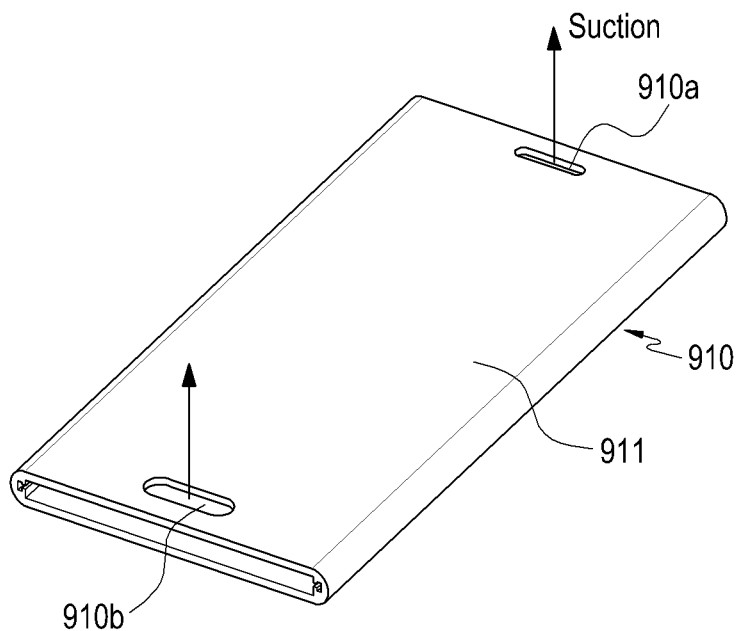
FIGS. 14A and 14B are perspective views illustrating an example process for sucking a display device 920 disposed bracket 930 inside a housing 910 according to an example embodiment of the present disclosure.
Figure 14B:
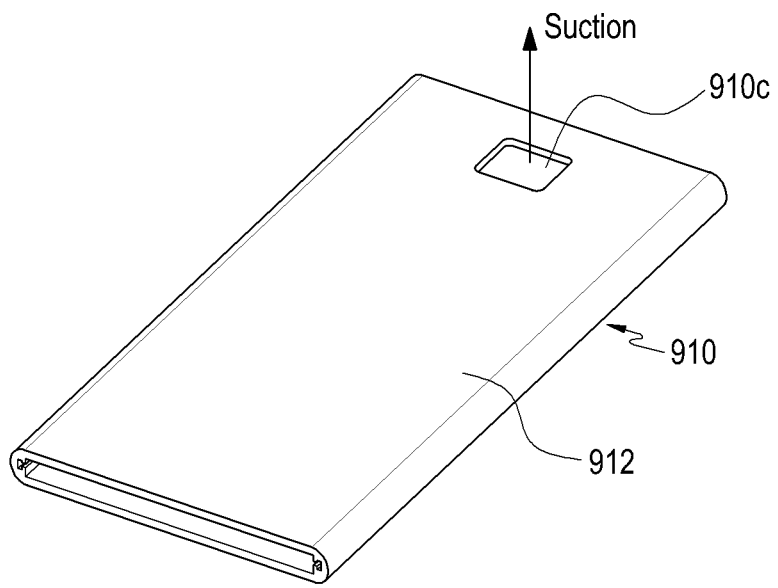

FIGS. 14A and 14B are perspective views illustrating a process for sucking a display device (920)-disposed bracket 930 inside a housing 910 according to an example embodiment of the present disclosure. FIG. 14A illustrates a process for joining the bracket 930 with the housing 910 by suction through the holes 910a and 910b formed in the first surface 911 of the housing 910. FIG. 14B illustrates a process for joining the bracket 930 with the housing 910 by suction through the hole 910c formed in the second surface 912 of the housing 910.

Referring to FIG. 14A, the bracket 930 (see, e.g., FIG. 13) may include a length-adjustable adjusting member. For example, the adjusting member may include a material or hinge structure that may be stretchable as the length is adjusted.

According to an embodiment of the present disclosure, the bracket 930 inserted in the shrunken state may be expanded by suction through the holes 910a, 910b, and 910c. For example, the bracket 930 may be stretched in the first direction +Z, second direction −Z, and/or third direction X through the adjusting member. Accordingly, the bracket 930 stretched by suction may directly be attached to the inner surface of the light-transmitting housing 910 with the display device 920 disposed therebetween.

A dielectric layer may be disposed between the housing 910 and the display device 920 to join the housing 910 and the display device 920. For example, the dielectric layer may include silicone, air, a foam, a membrane, an OCA, sponge, rubber, an ink, or a polymer (e.g., PC or PET), or the like, but is not limited thereto.

Figure 15:
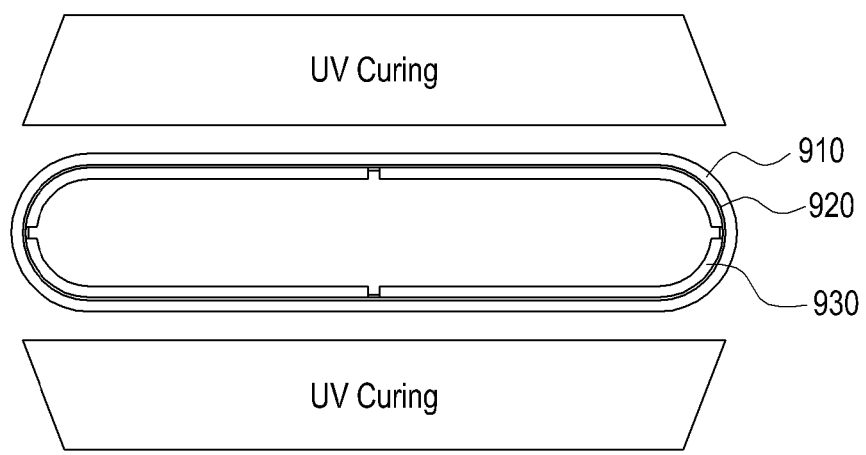
FIG. 15 is a diagram illustrating an example process for joining the housing 910 with a segmental bracket 930 according to an example embodiment of the present disclosure.

FIG. 15 is a diagram illustrating an example process for joining the housing 910 with a segmental bracket 930 according to an example embodiment of the present disclosure. The housing 910 may be attached to the display device 920 through the dielectric layer, and the display device 920 may be attached to the bracket 930 through an adhesive film.

Referring to FIG. 15, a light-cured resin layer, as the adhesive film, may be disposed between the housing 910 and the bracket 930. The light-cured resin may be a photosensitizer that is instantaneously cured, dried, or attached when irradiated with an ultraviolet (UV) beam. The processes of curing, drying, and attaching may simultaneously be performed by applying the light-cured resin and radiating UV light with a short wavelength causing a chemical reaction. As another example, the light-cured resin may be changed in structure responsive to the flexible structure of the housing 910 and display device 920, advantageously enabling joining.

According to an embodiment of the present disclosure, UV radiation may be performed with the bracket 930 contacting the inner surface of the housing 910 as tight as possible. In this operation, UV rays may be radiated from above and under the housing 910 to the housing 910 to evenly reach the entire area of the housing 910.

Figure 16:
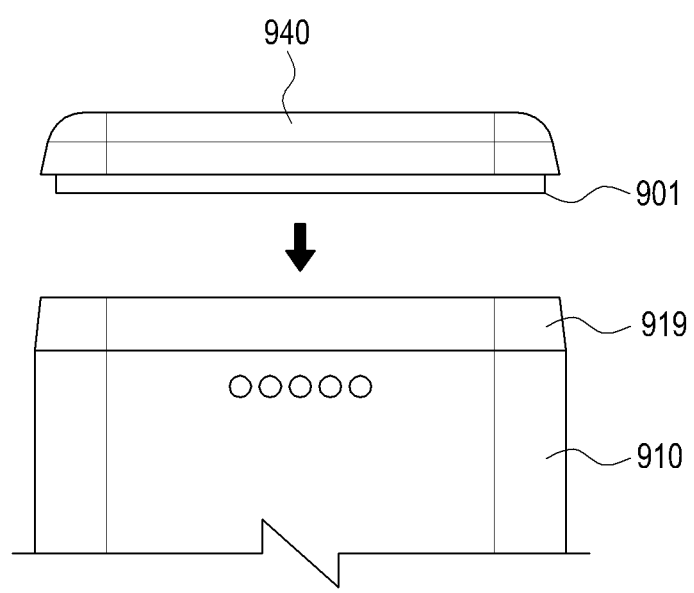
FIG. 16 is a diagram illustrating an example process for placing a cover 940 on an open end of the housing 910 according to an example embodiment of the present disclosure.

FIG. 16 is a diagram illustrating an example process for placing a cover 940 on an open end of the housing 910 according to an example embodiment of the present disclosure. Although FIG. 16 illustrates an example of fitting the cover 940 into only the top of the housing 910, the same process may also be performed on the bottom of the housing 910.

Referring to FIG. 16, the open ends of the housing 910 may be closed with all the electronic parts mounted inside the housing 910. According to an embodiment of the present disclosure, the covers 940 may be formed of caps that may close the top and bottom openings of the housing 910. The covers 940 may include a first cover disposed at the top and a second cover disposed at the bottom. The first cover and the second cover may be shaped to correspond to the top and bottom, respectively, of the housing 910.

According to an embodiment of the present disclosure, the first cover 940 may have a first step 901 that may, at least partially, be inserted into the top of the housing 910 having the inclined outer edges 919. As another example, the second cover may have a step that may, at least partially, be inserted into the bottom of the housing 910.

According to an embodiment of the present disclosure, the first step 901 of the first cover 940 may be fitted into the stepped portion of the housing 910, and the first step 901 and the end of the housing 910 may be joined together by bonding or using an adhesive film. As another example, the second cover may likewise be fitted into the bottom of the housing 910 by bonding or an adhesive film.

According to an embodiment of the present disclosure, the cover 940 may be formed of a different material from the housing 910 and may include an elastic substance that may prevent the electronic device from being broken when dropped. The cover 940 may include a soft material, e.g., at least one of thermoplastic polyurethane (TPU), thermoplastic silicone vulcanizate (TPSiV), or silicone.

According to an embodiment of the present disclosure, the cover 940 may be shaped to give a uni-body look along with the housing 910. For example, the housing 910 may have a curved and/or slopping surface 919 with a predetermined curvature R in each end edge as set forth above.

An alternative process is described below.

Figure 17:
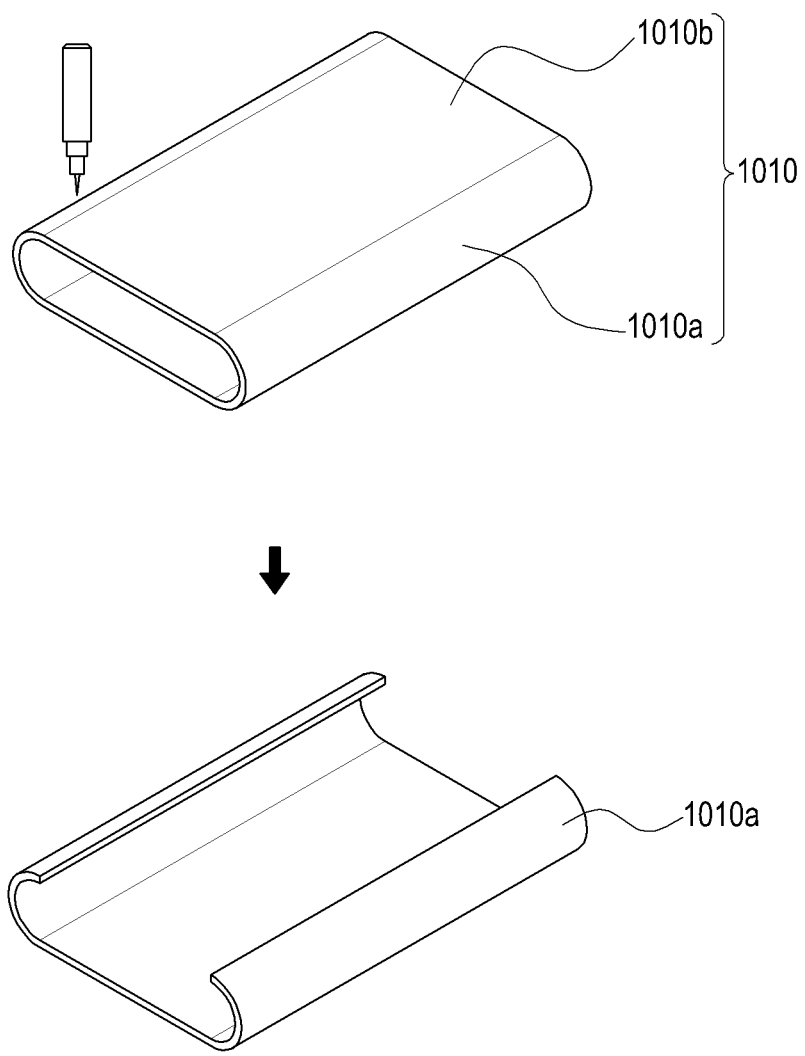
FIGS. 17 and 18 are diagrams illustrating an example process for making use of only a portion of the tubular housing 1010 according to an example embodiment of the present disclosure.
Figure 18:
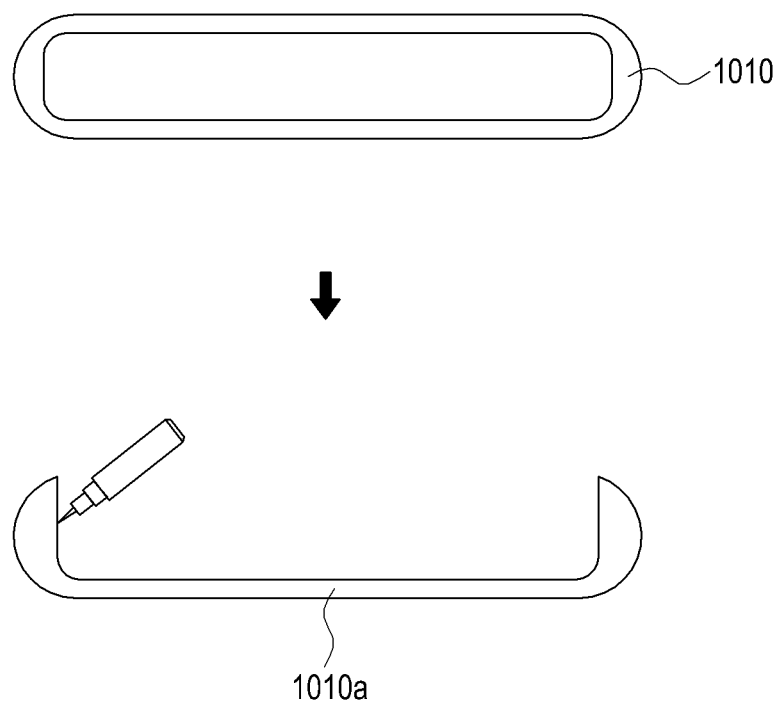
Figure 19:
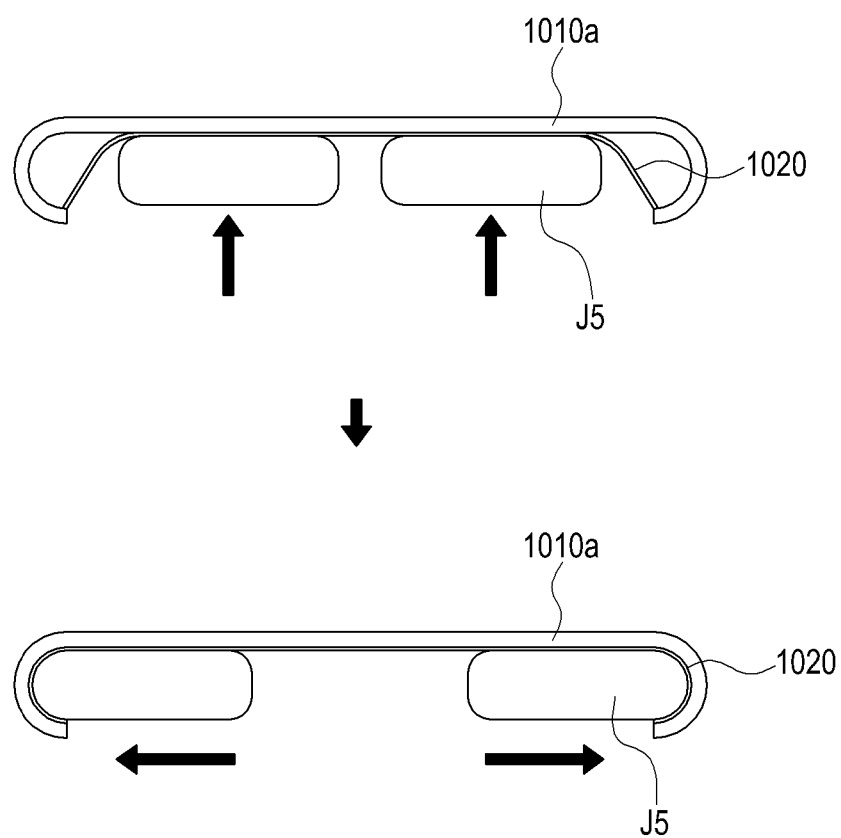
FIG. 19 is a diagram illustrating an example process for attaching the display 1020 onto the inner surface of the tubular glass housing 1010a according to an example embodiment of the present disclosure.

FIGS. 17, 18 and 19 are diagrams illustrating part of an example process for manufacturing an electronic device 1000 according to an example embodiment of the present disclosure. According to an embodiment of the present disclosure, among operations described above in connection with FIGS. 9 to 16, the operation of forming the housing may differ but the other operations may be alike. Operations which are different from above are described below.

FIGS. 17 and 18 are diagrams illustrating an example process for making use of only a portion of the tubular housing 1010 according to an example embodiment of the present disclosure. As set forth above, the housing 1010 may be manufactured by a process commonly known, e.g., extrusion.

Referring to FIG. 17, the housing 1010 may be formed to have openings in the ends, and the housing 1010 may include a transparent material, e.g., glass or plastic. For example, the housing 1010 may be formed of a glass tube.

The housing 1010 formed according to an embodiment of the present disclosure may undergo a CNC process, getting rid of the other portion 1010b than the portion 1010a which is intended for the electronic device. According to an embodiment of the present disclosure, the housing may be manufactured using the tubular glass housing 1010a for the portion corresponding to the front and sides of the electronic device while using a metal and/or plastic structure for the other portion. The portion for which the tubular glass housing 1010a is used may be varied depending on the appearance of the electronic device and the portion for which the display device is used.

FIG. 18 illustrates a process for adjusting the thickness of a portion of the inner surface of the tubular glass housing 1010. According to an embodiment of the present disclosure, at least a portion of the inner surface of the housing 1010a, which corresponds to the necessary portion, may be formed by a CNC process to have different thicknesses. For example, more cutting may be done to the portion of the inner surface of the tubular glass housing 1010a, corresponding to the front surface of the electronic device, for which the user desires to feel thinner, and no or relatively less cutting may be done to the portions of the inner surface of the tubular glass housing 1010a, corresponding to the side surfaces of the electronic device, for which the user desires to feel thicker. Accordingly, the front and side portion of the housing 1010a may be formed to have different thicknesses.

However, embodiments of the present disclosure are not limited to such process. For example, the portion of the tubular glass housing that is required to have more hardness or to be reinforced may be formed to be relatively thicker than the other in the process of manufacturing the housing.

Forming the portions of the tubular glass housing to differ in thickness may prevent damage to the electronic device while allowing the electronic device a better look.

FIG. 19 is a diagram illustrating an example process for attaching the display 1020 onto the inner surface of the tubular glass housing 1010a. According to an embodiment of the present disclosure, unlike in the above-described embodiment, the flexible display device 1010 may directly be attached onto the inner surface of the glass tube. Use of separate silicone pads J5 may enable the display device 1020 to be completely attached onto the inner surface of the curved glass tube.

Referring to FIG. 19, a portion of the glass tube may be used as the housing 1010a, and the sides of the housing 1010a may be curved. In conventional manners, it is hard to completely attach a flexible display device onto the inner surface of the housing bent or curved at 90 degrees or more.

According to an embodiment of the present disclosure, after the flexible display device 1020 is preliminarily attached onto the inner surface of the tubular glass housing 1010a, they may completely be attached together by the separate silicone pads. The separate silicone pads J5 may approach the front inner surface of the tubular glass housing 1010a to pressurize the display device that has been preliminarily attached. The silicone pads J5 may then spread from each other to reach the inner side curved surfaces of the tubular glass housing 1010a, pressurizing the display device. The use of the separate silicone pads enables attachment of the flexible display device onto the inner surface of the tubular glass housing in an efficient way.

An alternative process is described below.

FIGS. 20, 21, 22A, 22B and 22C are diagrams illustrating part of an example process for manufacturing an electronic device 1100 according to an example embodiment of the present disclosure. According to an embodiment of the present disclosure, among operations described above in connection with FIGS. 9 to 16, the operation of forming the housing may differ but the other operations may be alike. An operation which is different from above is described below.

FIGS. 20, 21, 22A, 22B and 22C illustrate an example process for separately processing a glass tube and then attaching, according to an example embodiment of the present disclosure. As set forth above, the housing 1110 may be manufactured by a process commonly known, e.g., extrusion.

Figure 20:
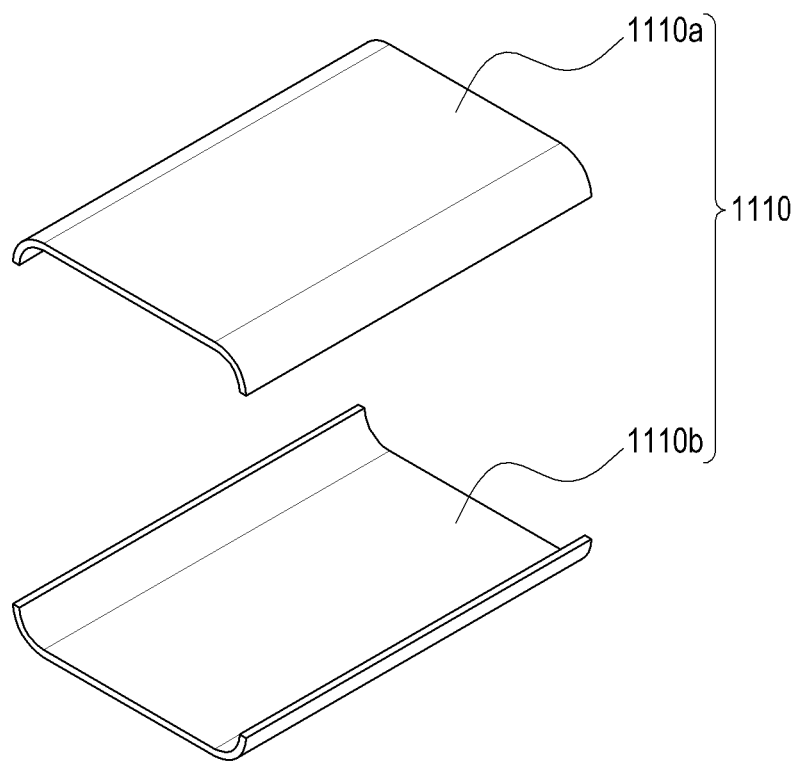
Figure 21:
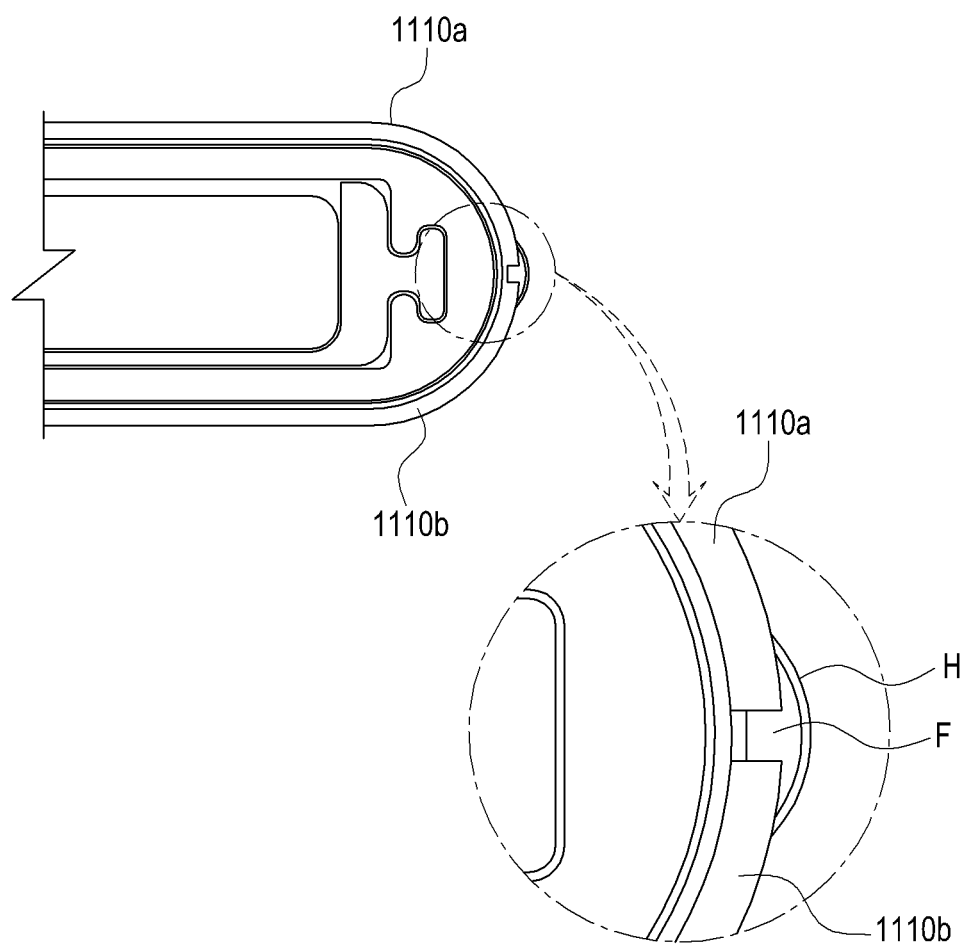

Referring to FIG. 20, the housing 1110 may be formed to have openings in the ends, and the housing 1110 may include a transparent material, e.g., glass or plastic. For example, the housing 1110 may be formed of a glass tube.

According to an embodiment of the present disclosure, the formed housing 1100 may be cut into two portions. For example, the housing 1110 may include a first housing part 1110a with the front surface and curved side surfaces of the housing 1110 and a second housing part 1110b with the rear surface and curved side surfaces of the housing 1110.

Thereafter, the separated tubular glass housing 1110 may be joined together. However, embodiments of the present disclosure are not limited to the order of process. For example, the joining process may also be performed after mounting electronic parts and the display device in the bracket.

Referring to FIGS. 21, 22A, 22B and 22C, the bracket 1130 may be provided, and the display device 1120 may be disposed on the outer surface of the bracket 1130. in the joining process, the first housing part 1110a and the second housing part 1110b may be end-to-end aligned with each other, and the gap along the joining line between the housings 1110a and 1110b may be filled with an adhesive material F. The adhesive material F may be subject to a curing process to firmly join the first and second housing parts 1110a and 1110b. The adhesive material F may include an optically clear resin (OCR).

Thereafter, the adhesive material cured along the joining line may be polished off not to spoil the appearance of the housing 1110. The polishing process may reinforce attachment between the silky surface and a coating agent that is to be applied.

Then, a coat layer H may be formed on the polished portion to have a curvature corresponding to the curvatures of the first housing part 1110a and the second housing part 1110b. The coat layer H may be a hard coat or ceramic coat. The coat layer H may protect the internal electronic parts from external impacts. The coat layer H may also keep the first housing part 1110a and the second housing part 1110b jointed together more securely and firmly.

According to an example embodiment of the present disclosure, an electronic device may comprise a housing including two opposite open ends and at least a portion comprising a light-transmitting material, a bracket disposed inside the housing and having a shape corresponding to the housing, a flexible display device disposed between the housing and the bracket and configured to display information to an outside through the light-transmitting portion of the housing, and a plurality of covers closing the open ends of the housing and supporting two opposite ends of the bracket, wherein the bracket comprises an inner space for mounting electronic parts, and the bracket is length-adjustable in at least one direction.

According to an example embodiment of the present disclosure, the housing may include a first surface facing in a first direction, a second facing in a second direction opposite to the first direction, and a third surface extending from the first surface to the second surface and forming a curved surface, wherein at least a portion of the first surface, the second surface, and the third surface comprise transparent glass.

According to an example embodiment of the present disclosure, the bracket may include a plurality of frames and length-adjustable adjusting members disposed between the plurality of frames or respective surfaces of the plurality of frames and configured to connect the plurality of frames in a closed loop shape.

According to an example embodiment of the present disclosure, the plurality of frames may be formed of four segments, wherein each of the plurality of frames at least partially includes a curved structure, and a support may be formed at a side in the inner space to support a printed circuit board.

According to an example embodiment of the present disclosure, the adjusting members may include a pair of first adjusting members facing each other and a pair of second adjusting members facing each other in a different direction from the first adjusting members.

According to an example embodiment of the present disclosure, the first adjusting members are length-adjustable in the first direction or the second direction, and the second adjusting members are length-adjustable in a third direction perpendicular to the first direction.

According to an example embodiment of the present disclosure, the adjusting members of the bracket may include one or more of an elastic material and a hinge structure.

According to an example embodiment of the present disclosure, the adjusting members of the bracket may be formed to surround the plurality of frames and to include an elastic material shaped as a closed loop.

According to an example embodiment of the present disclosure, the two opposite ends of the housing each may have a slope and are smaller in circumference than a middle portion of the housing.

According to an example embodiment of the present disclosure, the plurality of covers each may include a step that is at least partially internally fitted to an end of the housing, and an end of each of the plurality of covers may have the same curvature as one of the two opposite ends of the housing.

According to an example embodiment of the present disclosure, the plurality of covers may comprise at least one thermoplastic polyurethane (TPU), thermoplastic silicone vulcanizate (TPSiV), and silicone.

According to an example embodiment of the present disclosure, the housing may overall be formed of a glass tube, and the flexible display device may be formed in a closed loop shape corresponding to the glass tube of the housing to allow visual content displayed on the display device to form continuous loops.

According to an example embodiment of the present disclosure, a dielectric layer may be disposed between the housing and the display device, an adhesive film may be disposed between the display device and the bracket, and the housing, the display device, and the bracket may be attached together by the dielectric layer and the adhesive film.

According to an example embodiment of the present disclosure, the supporting member may project from an inner surface of the bracket to support the printed circuit board in parallel with a surface of the bracket, and the electronic device may further comprise a connecting member electrically connecting the printed circuit board inserted into the inner space of the bracket with the display device disposed on an outer surface of the bracket.

According to an example embodiment of the present disclosure, the housing may be formed of a glass tube including an upper housing part and a lower housing part, a dielectric layer may be disposed between the upper housing part and the lower housing part to join the upper housing part and the lower housing part, and a coat layer may be formed on an outer surface of the dielectric layer to have a curvature corresponding to the curvature of the upper housing part and the lower housing part.

According to an example embodiment of the present disclosure, a method for manufacturing an electronic device may comprise preparing a housing that includes two opposite open ends and at least a portion comprising a light-transmitting material, preparing a bracket having a shape corresponding to the housing and that is length-adjustable in a plurality of directions, placing a flexible display device to surround at least a portion of the bracket, attaching the housing with the bracket after inserting the bracket into an inside of the housing, with the bracket attached with the flexible display device and an electronic part mounted therein, and closing the open ends of the housing with covers.

According to an example embodiment of the present disclosure, the housing may be a glass tube, and wherein the glass tube may be used as a whole or part of the housing in preparing the housing.

According to an example embodiment of the present disclosure, preparing the housing may include forming a slope with a predetermined curvature in each of the two opposite ends of the housing, forming at least one hole in a front surface and a rear surface of the housing, polishing an inner surface of the housing, and coating an outer surface of the housing, wherein the polishing includes polishing the housing by moving back and forth a polishing pad formed of a material including a cerium oxide powder on the inner surface of the housing and the coating may include loading the housing on a coating jig rotatable at 360 degrees and coating the overall outer surface of the loaded housing by a jet process.

According to an example embodiment of the present disclosure, the attaching the housing with the bracket may include stretching the bracket and attaching the bracket onto the inner surface of the bracket by suction through a hole prepared in the housing after inserting the flexible display device-disposed bracket in the inner space of the housing and joining the housing and the bracket by curing, drying, and attaching a light-cured resin layer disposed between the housing and the bracket by radiating an ultraviolet (UV) ray to the light-cured resin layer.

According to an example embodiment of the present disclosure, in closing the covers, the covers each may include a step to fit into each of the ends of the housing, and a curvature of each cover may be the same as a curvature of each end of the housing.

According to an example embodiment of the present disclosure, the housing may be formed of a glass tube including an upper housing part and a lower housing part. The method may further comprise attaching the upper housing part with the lower housing part. Attaching the upper housing part with the lower housing part may include applying and curing an adhesive layer between the upper housing part and the lower housing part, polishing the cured adhesive layer, and placing a coat layer that has a curvature corresponding to the curvature of the upper housing part and the lower housing part on the polished adhesive layer.

While the present disclosure has been illustrated and described with reference to various example embodiments thereof, it will be understood that the example embodiments are intended to be illustrative, not limiting. One of ordinary skill in the art will understand that various modifications, alternatives and/or variations are possible and fall within the true spirit and full scope of the disclosure as defined by the appended claims and their equivalents.

What is claimed is:

1. An electronic device, comprising:
a housing including two opposite open ends and at least a portion of the housing comprising a light-transmitting material;
a bracket disposed inside the housing and having a shape corresponding to the housing;
a flexible display device disposed between the housing and the bracket and configured to display information to an outside through the light-transmitting portion of the housing; and
a plurality of covers closing the open ends of the housing and supporting two opposite ends of the bracket, wherein the bracket includes an inner space for mounting electronic parts, and the bracket is length-adjustable in at least one direction.

2. The electronic device of claim 1, wherein the housing comprises a first surface facing a first direction, a second surface facing a second direction opposite the first direction, and a third surface extending from the first surface to the second surface and forming a curved surface, wherein at least a portion of the first surface, the second surface, and the third surface comprise transparent glass.

3. The electronic device of claim 2, wherein the bracket includes a plurality of frames and length-adjustable adjusting members disposed between the plurality of frames and connecting the plurality of frames in a closed loop shape.

4. The electronic device of claim 3, wherein the plurality of frames comprise four segments, wherein each of the four segments of the plurality of frames at least partially include a curved structure, and the electronic device further comprising a support disposed at a side in the inner space and configured to support a printed circuit board.

5. The electronic device of claim 3, wherein the adjusting members comprise a pair of first adjusting members facing each other and a pair of second adjusting members facing each other in a different direction from the first adjusting members.

6. The electronic device of claim 5, wherein the first adjusting members are length-adjustable in the first direction or the second direction, and the second adjusting members are length-adjustable in a third direction perpendicular to the first direction.

7. The electronic device of claim 6, wherein the adjusting members of the bracket include an elastic material and/or a hinge structure.

8. The electronic device of claim 6, wherein the adjusting members of the bracket are formed to surround the plurality of frames and to include an elastic material shaped as a closed loop.

9. The electronic device of claim 5, wherein the two opposite ends of the housing each have a slope and have a smaller circumference than a middle portion of the housing.

10. The electronic device of claim 9, wherein the plurality of covers each include a step configured to be at least partially internally fitted to an upper end and/or a lower end of the housing, and wherein an end of each of the plurality of covers has a same curvature as one of the two opposite ends of the housing.

11. The electronic device of claim 10, wherein the plurality of covers include at least one of: thermoplastic polyurethane (TPU), thermoplastic silicone vulcanizate (TPSiV), and silicone.

12. The electronic device of claim 5, wherein the housing comprises a glass tube, and wherein the flexible display device is formed in a closed loop shape corresponding to the glass tube of the housing, and is configured to allow visual content displayed on the display device to form continuous loops.

13. The electronic device of claim 12, wherein a dielectric layer is disposed between the housing and the display device, wherein an adhesive film is disposed between the display device and the bracket, and wherein the housing, the display device, and the bracket are attached together by the dielectric layer and the adhesive film.

14. The electronic device of claim 4, wherein the support projects from an inner surface of the bracket to support the printed circuit board in parallel with a surface of the bracket, and wherein the electronic device further comprises a connecting member electrically connecting the printed circuit board inserted into the inner space of the bracket with the display device disposed on an outer surface of the bracket.

15. The electronic device of claim 1, wherein the housing comprises a glass tube including an upper housing part and a lower housing part, wherein a dielectric layer is disposed between the upper housing part and the lower housing part and is configured to join the upper housing part and the lower housing part, and wherein a coating layer is formed on an outer surface of the dielectric layer to have a curvature corresponding to the curvature of the upper housing part and the lower housing part.

16. A method for manufacturing an electronic device, the method comprising:
preparing a housing that includes two opposite open ends wherein at least a portion of the housing comprises a light-transmitting material;
preparing a bracket having a shape corresponding to the housing and that is length-adjustable in a plurality of directions;
placing a flexible display device to surround at least a portion of the bracket;
attaching the housing to the bracket after inserting the bracket into an inside of the housing, with the bracket attached with the flexible display device and an electronic part mounted therein; and
closing the open ends of the housing with covers.

17. The method of claim 16, wherein the housing comprises a glass tube, and wherein the glass tube is used as a whole or part of the housing in preparing the housing.

18. The method of claim 17, wherein preparing the housing includes forming a slope with a predetermined curvature in each of the two opposite ends of the housing, forming at least one hole in a front surface and a rear surface of the housing, polishing an inner surface of the housing, and coating an outer surface of the housing, wherein the polishing includes polishing the housing by moving a polishing pad comprising a material including a cerium oxide powder back and forth on the inner surface of the housing and the coating includes loading the housing on a coating jig rotatable at 360 degrees and coating the overall outer surface of the loaded housing by a jet process.

19. The method of claim 17, wherein the attaching the housing with the bracket includes stretching the bracket and attaching the bracket onto the inner surface of the housing by suction through a hole provided in the housing after inserting the flexible display device-disposed bracket in the inner space of the housing and joining the housing and the bracket by curing, drying, and attaching a light-cured resin layer disposed between the housing and the bracket by radiating an ultraviolet (UV) ray to the light-cured resin layer,
wherein the covers each include a step configured to fit into each of the ends of the housing, and wherein a curvature of each cover is the same as a curvature of each end of the housing.

20. The method of claim 17, wherein the housing comprises a glass tube including an upper housing part and a lower housing part, wherein the method comprises attaching the upper housing part with the lower housing part, and wherein attaching the upper housing part with the lower housing part includes applying and curing an adhesive layer between the upper housing part and the lower housing part, polishing the cured adhesive layer, and providing a coating layer having a curvature corresponding to the curvature of the upper housing part and the lower housing part on the polished adhesive layer.

* * * * *